US007610447B2

(12) United States Patent
Perego et al.

(10) Patent No.: US 7,610,447 B2
(45) Date of Patent: Oct. 27, 2009

(54) UPGRADABLE MEMORY SYSTEM WITH RECONFIGURABLE INTERCONNECT

(75) Inventors: Richard E. Perego, San Jose, CA (US);
Frederick A. Ware, Los Altos, CA (US);
Ely K. Tsern, Los Altos, CA (US);
Craig E. Hampel, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 92 days.

(21) Appl. No.: 09/797,099

(22) Filed: Feb. 28, 2001

(65) Prior Publication Data

US 2004/0221106 A1 Nov. 4, 2004

(51) Int. Cl.
*G06F 12/00* (2006.01)
*G06F 1/04* (2006.01)

(52) U.S. Cl. .................. 711/115; 711/4; 711/100; 711/168; 711/170; 711/212; 710/300; 710/301; 710/302; 710/303; 710/304; 710/305; 710/306; 710/100; 710/104; 710/38; 365/52; 365/63

(58) Field of Classification Search ............... 710/300, 710/301, 302, 303, 304, 305, 104, 316, 38; 711/115; 365/52, 63
See application file for complete search history.

(56) References Cited

U.S. PATENT DOCUMENTS

| 4,766,538 | A | 8/1988 | Miyoshi | 364/200 |
|---|---|---|---|---|
| 4,985,867 | A | 1/1991 | Ishii | 365/221 |
| 5,307,469 | A | 4/1994 | Mann | 395/425 |
| 5,334,962 | A | 8/1994 | Higgins | 333/247 |
| 5,394,528 | A | 2/1995 | Kobayashi et al. | 395/325 |
| 5,530,814 | A | 6/1996 | Wong | 395/312 |
| 5,559,970 | A | 9/1996 | Sharma | 395/312 |
| 5,652,870 | A | 7/1997 | Yamasaki et al. | 395/500 |
| 5,655,113 | A | 8/1997 | Leung | 395/552 |
| 5,717,871 | A | 2/1998 | Hsieh | 395/250 |
| 5,717,901 | A | 2/1998 | Sung et al. | 395/497.01 |
| 5,764,590 | A | 6/1998 | Iwamoto | 365/233 |
| 5,787,267 | A | 7/1998 | Leung | 395/482 |

(Continued)

FOREIGN PATENT DOCUMENTS

EP 0 887 737 A2 12/1998

(Continued)

OTHER PUBLICATIONS

Microsoft Computer Dictionary, Copyright 1999, Fourth Edition, p. 145.*

(Continued)

*Primary Examiner*—Stephen C Elmore
*Assistant Examiner*—Midys Rojas
(74) *Attorney, Agent, or Firm*—Silicon Edge Law Group LLP; Arthur J. Behiel

(57) ABSTRACT

Described herein is a point-to-point memory communications architecture, having a point-to-point signal line set associated with each of a plurality of connectors or module positions. When the system is fully populated, there is a one-to-one correspondence between signal line sets and memory modules. In systems that are not fully populated, the system is configurable to use a plurality of the signal line sets for a single memory module.

74 Claims, 15 Drawing Sheets

U.S. PATENT DOCUMENTS

| | | | |
|---|---|---|---|
| 5,793,998 A | 8/1998 | Copeland et al. | |
| 5,798,998 A | 8/1998 | Fukushima et al. | |
| 5,801,985 A | 9/1998 | Roohparvar et al. | 365/185.01 |
| 5,831,925 A | 11/1998 | Brown | 365/230.03 |
| 5,852,640 A | 12/1998 | Kliza et al. | 375/356 |
| 5,852,725 A | 12/1998 | Yen | |
| 5,893,924 A | 4/1999 | Vakkalagadda | 711/165 |
| 5,893,927 A * | 4/1999 | Hovis | 711/171 |
| 5,958,033 A | 9/1999 | Schubert et al. | |
| 5,995,379 A | 11/1999 | Kyougoku | 361/803 |
| 6,034,878 A * | 3/2000 | Osaka et al. | 365/52 |
| 6,038,132 A | 3/2000 | Tokunaga | 361/760 |
| 6,047,347 A | 4/2000 | Hansen et al. | 710/127 |
| 6,064,585 A | 5/2000 | Mori | 365/63 |
| 6,138,185 A | 10/2000 | Nelson | 710/33 |
| 6,141,273 A | 10/2000 | Ku et al. | 365/201 |
| 6,144,576 A | 11/2000 | Leddige | 365/63 |
| 6,144,577 A | 11/2000 | Hidaka | 365/63 |
| 6,191,998 B1 | 2/2001 | Reddy | 365/230.05 |
| 6,219,785 B1 * | 4/2001 | Smith | 713/1 |
| 6,247,087 B1 | 6/2001 | Apostol, Jr. | 710/108 |
| 6,307,769 B1 | 10/2001 | Nuxoll | 365/63 |
| 6,404,660 B1 | 6/2002 | Perino | 365/51 |
| 6,519,669 B1 | 2/2003 | Yanagisawa | 710/304 |
| 6,625,687 B1 * | 9/2003 | Halbert et al. | 711/105 |
| 6,742,098 B1 * | 5/2004 | Halbert et al. | 711/172 |
| 6,889,304 B2 | 5/2005 | Perego et al. | |
| 2002/0031035 A1 | 3/2002 | Tsuji | 365/230.03 |
| 2002/0053010 A1* | 5/2002 | Piccirillo et al. | 711/170 |
| 2003/0112675 A1 | 6/2003 | Mukai et al. | 365/200 |
| 2004/0019756 A1 | 1/2004 | Ware | 711/170 |

FOREIGN PATENT DOCUMENTS

| | | |
|---|---|---|
| EP | 887737 A2 | 12/1998 |
| EP | 0887737 A2 | 12/1998 |
| GB | 2367400 A | 4/2002 |
| WO | WO 91/16680 A1 | 10/1991 |
| WO | WO 2004/111856 A1 | 12/2004 |

OTHER PUBLICATIONS

Kurian, John, Lizy, "VaWiRAM: A Variable Width Random Access Memory Module." 1995 IEEE, 9th International Conference on VLSI Design—1996. pp. 219-224.

Ware, Frederick A., Rambus, Inc., "Direct RDRAM 256/288-Mbit (512Kx16/18x32s) Data Sheet", Preliminary Information, Document DL0060 Version 0.90, 1999, pp. 1-66.

Technical Brief, "GeForce3: Lightspeed Memory Architecture", NVIDIA Corporation, pp. 1-9.

"The Authoritative Dictionary of IEEE Standards Terms," Copyright 2000, IEEE Press, Seventh Edition, p. 252.

Satoh, Kisayasu et al., "A 209K-Transistor ECL Gate Array with RAM", IEEE Journal of Solid-State Circuits, vol. 24, No. 5, Oct. 1989, pp. 1275-1281.

"Design Optimization Techniques for Double Data Rate SDRAM Modules." Fairchild Semiconductor, Jul. 2000. 6 pages.

Masumoto, Rodney T., "Configurable On-Chip RAM Incorporated Into High Speed Logic Array", Proceedings of the IEEE 1985 Custom Integrated Circuits Conference, May 20-23, 1985, pp. 240-243.

Kirihata, Toshiaki, et al., "A 390-mm2, 16-Bank, I-Gb DDR SDRAM with Hybrid Bitline Architecture", IEEE Journal of Solid-State Circuits, vol. 34, No. 11, Nov. 1999, pp. 1580-1588.

Rynearson, John "VMEbus Daisy Chains." Reprinted from the VITA Journal. Originally writtten in Mar. 1997, last pg. of article updated Sep. 15, 1999. 2 pgs.

* cited by examiner

| Width | Write | | Read | | Connections |
|---|---|---|---|---|---|
| | $W_A$ | $W_B$ | $R_A$ | $R_B$ | |
| 1 | 1 | 1 | $A_0$ | $A_1$ | 0 |
| 2 | 0 | 1 | 0 | $A_0$ | 0 and 1 |
| 4 | 0 | 0 | 0 | 0 | 3, 2, 1, and 0 |

*Fig. 20*

UPGRADABLE MEMORY SYSTEM WITH RECONFIGURABLE INTERCONNECT

TECHNICAL FIELD

This invention relates to computer memory technology.

BACKGROUND

FIG. 1 shows an example of a prior art memory system 10. In this example, the system resides on a computer motherboard or backplane 12. The system includes a plurality of female electrical connectors 13, which accept memory modules 14 (only one of which is shown here). Each memory module contains a plurality of memory devices 16, typically packaged as discrete integrated circuits (ICs). Memory devices 16 are usually some type of read/write memory, such as RAMs, DRAMs, flash, SRAM, and many other types. ROM devices might also be used. Alternatively, discrete integrated circuits might be assembled into an intermediate level of packaging before being attached to the memory module.

A memory controller 18 is located on motherboard 12. The memory controller communicates with memory modules 14 and memory devices 16 through electrical connectors 13. Memory controller 18 also has an interface (not shown) that communicates with other components on the motherboard, allowing those components to read from and write to memory.

Communications between the controller and the memory modules is by way of a set of signal lines 19, which is typically an electrical bus that extends from the controller, to each of the connectors in parallel, and to the modules. A bus such as this has a plurality of data lines corresponding to data bits of memory words. If a bus has sixteen data lines, the system expects memory modules that generate and accept sixteen parallel data bits.

It is also possible that other signal lines would be present. These additional signal lines could have a different interconnection topology than what is shown for signal lines 19.

The system works with different numbers of memory modules, and with modules having different memory capacities. Also, the specific configuration of memory devices on each module can be varied. A system such as this is normally designed for a specific signal width: for a specified number of signal lines from the controller to the memory modules.

FIG. 2 shows an alternative prior art memory system 30, utilizing point-to-point memory communications rather than a bussed communications structure. The system of FIG. 2 includes a motherboard or backplane 32 and a plurality of female electrical connectors 33 (only two such connectors are shown). Each connector 33 accepts a respective memory module 34. A memory controller 38 supervises and provides communications with the memory modules.

Rather than using bussed signal lines, the system of FIG. 2 includes an independent set of signal lines 36 corresponding to each connector 33. Each set of signal lines extends from memory controller 38 to one of the connectors.

This type of signal line arrangement is referred to as a "point-to-point" configuration, and has several advantages over the bussed structure of FIG. 1, especially in high-speed systems:

Signal transmitters and receivers can be located at ends of transmission lines for optimum configuration of termination circuitry.

No driver handoff between devices is required, which in turn eases device driver output matching requirements, improves efficiency, and simplifies device simulation, characterization, and system-level validation.

Transmitter pre-emphasis equalization circuitry can be simplified, because inter-symbol interference needs to be compensated for only a single receive node.

In some cases, point-to-point interconnects are shorter than bussed interconnects, allowing reduced signal attenuation, reduced flight time, simplified delay matching, and fewer impedance discontinuities.

The memory controller can integrate clock control or calibration circuitry, providing opportunities for system level cost reduction.

BRIEF DESCRIPTION OF THE DRAWINGS

FIG. 20 is a table showing control input states to achieve specified data widths in the memory module shown in FIG. 17.

DETAILED DESCRIPTION

The following description sets forth specific embodiments of memory systems and components that incorporate elements recited in the appended claims. The embodiments are described with specificity in order to meet statutory requirements. However, the description itself is not intended to limit the scope of this patent. Rather, the inventors have contemplated that the claimed invention might also be embodied in other ways, to include different elements or combinations of storage elements similar to the ones described in this document, in conjunction with other present or future technologies.

Reconfigurable Interconnect Topology

Figure 1:
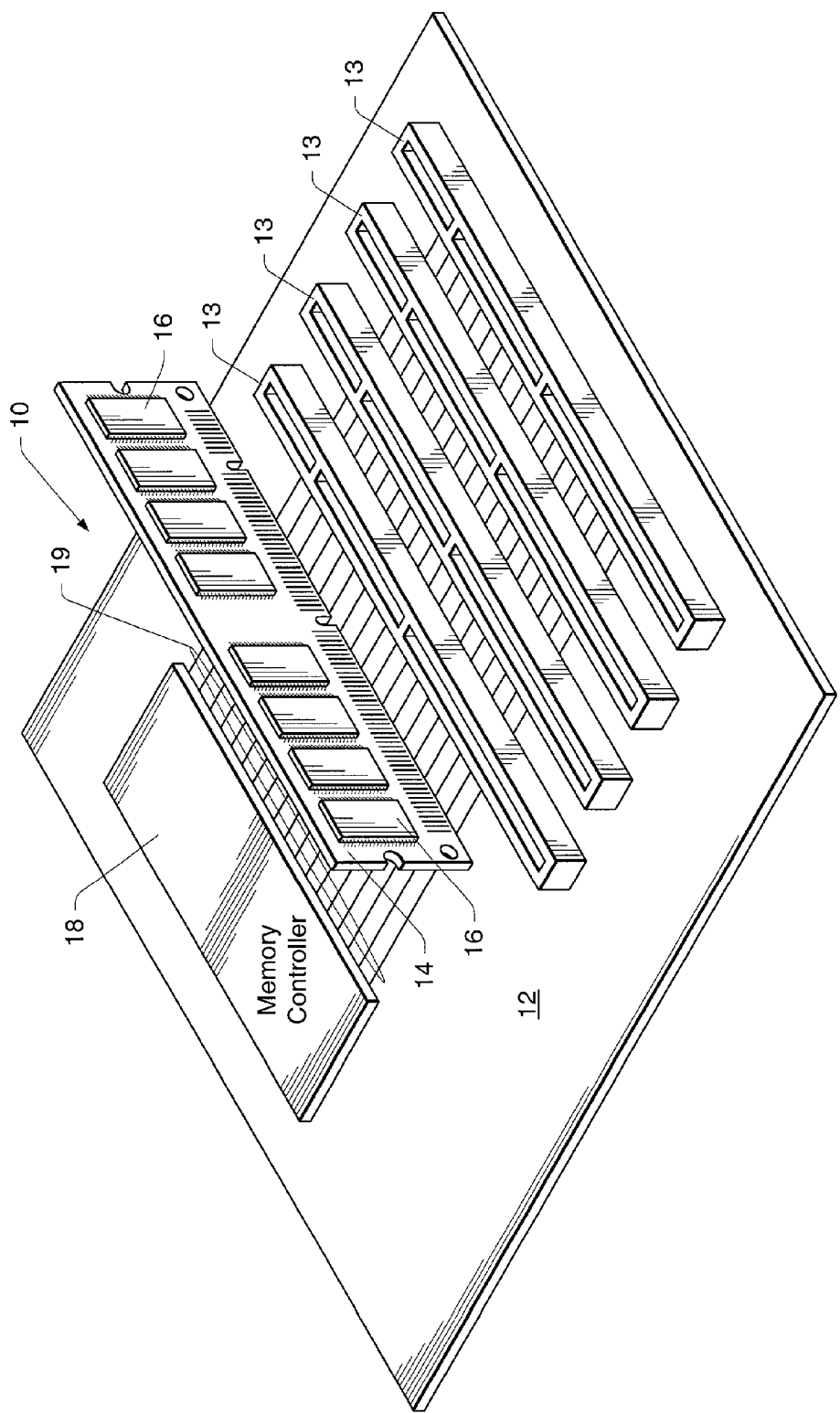
FIG. 1 is a diagrammatic representation of a prior art bussed memory system.
Figure 2:
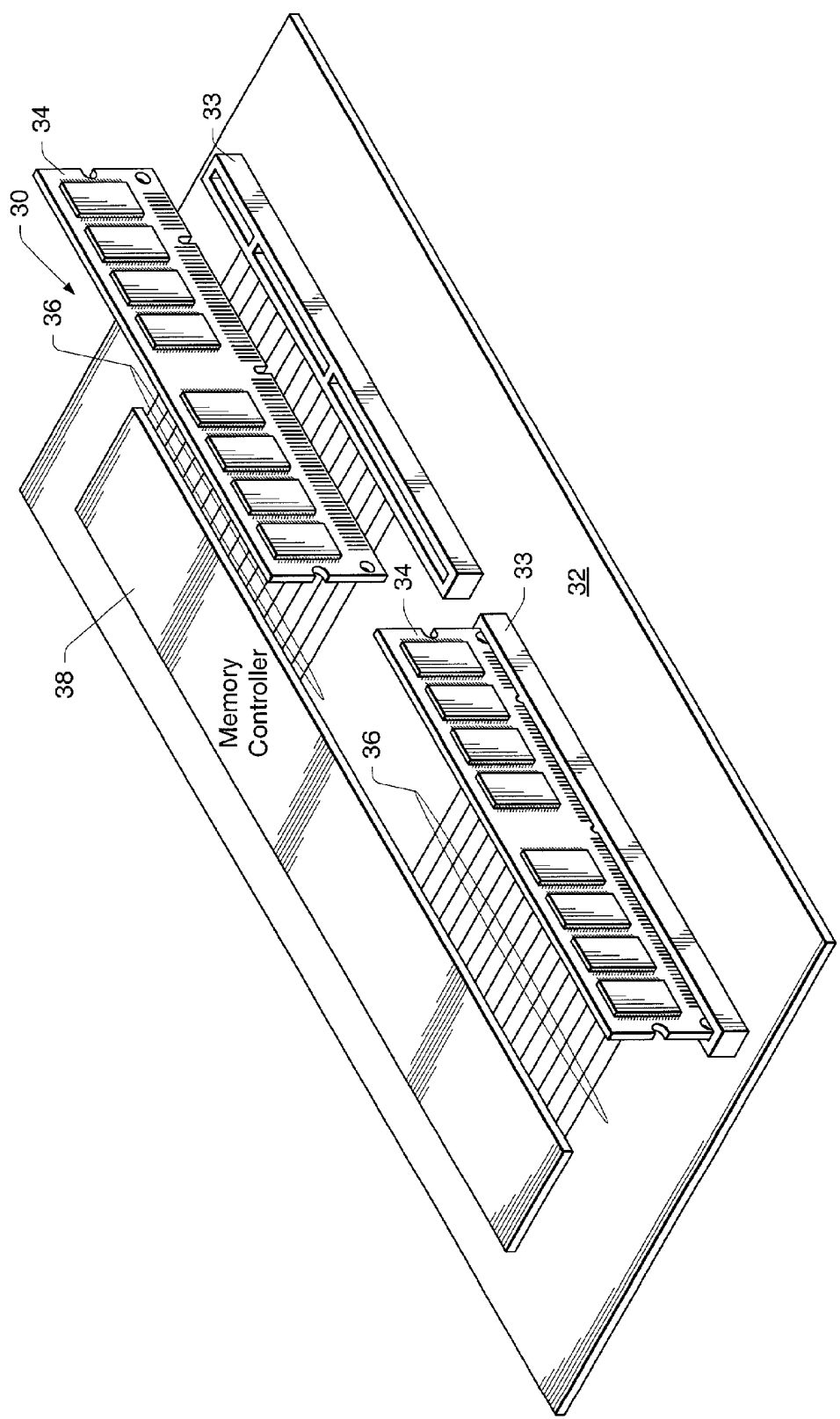
FIG. 2 is a diagrammatic representation of a prior art point-to-point memory system.
Figure 3:
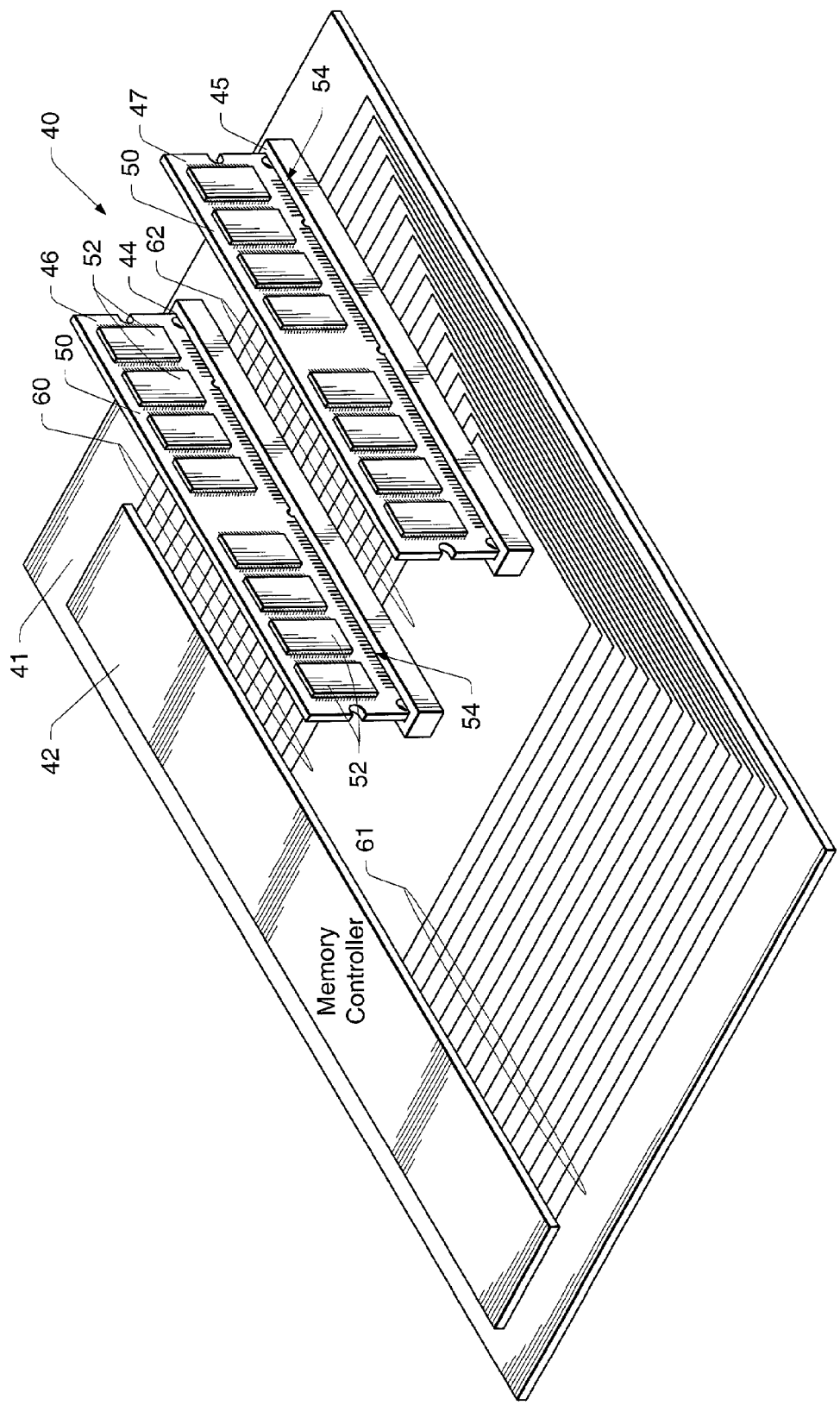
FIG. 3 is a diagrammatic representation of a point-to-point memory system in accordance with an embodiment of the invention.
Figure 4:
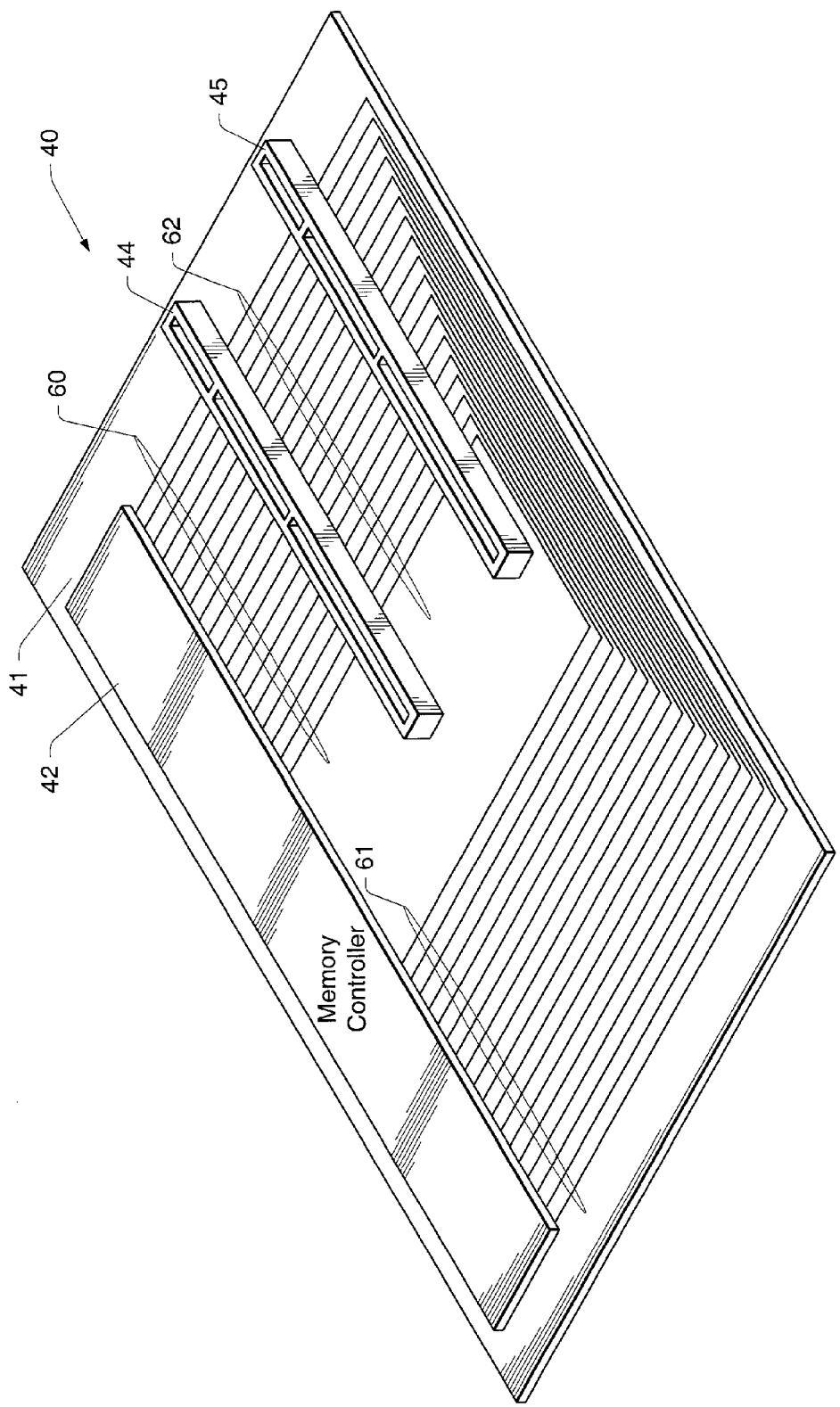
FIG. 4 is a diagrammatic representation of the point-to-point memory system of FIG. 3, with memory modules omitted for clarity.

FIGS. 3 and 4 illustrate one embodiment of a signal interconnect system 40 for use with one or more modules. This system utilizes point-to-point signaling in a way that permits maximum utilization of existing signal lines while accommodating varying numbers of memory modules. It is possible in a system such as this to utilize all individual sets of point-to-point signaling lines, even when less than all of the available memory sockets are occupied.

Referring to FIG. 3, system 40 includes a computer motherboard or system lo backplane 41, upon which are mounted a memory controller 42 and a plurality of electrical receptacles or connectors 44 and 45. The connectors are memory module sockets, and are configured to receive installable/removable memory modules 46 and 47.

Although this description is in the context of a memory system, it should be noted that the different embodiments are applicable as well to other types of systems that transfer data to and from installable modules. Thus, in some embodiments, connectors 44 and 45 might receive logic modules other than memory modules.

Each of memory modules 46 and 47 comprises a module backplane 50 and a plurality of integrated memory circuits 52. Each memory module has first and second opposed rows of electrical contacts, along opposite surfaces of its backplane. Only one row of contacts 54 is visible in FIG. 3. There are corresponding rows of connector contacts (not visible in FIG. 3) in each of connectors 44 and 45. For purposes of the following discussion, the left-most contact rows in the orientation of FIG. 3 will be arbitrarily designated as the "first" contact rows and the right-most contact rows will be designated as "second" contact rows. Similarly, the left-most connector 44 will be referred to as the "first" connector, and the right-most connector 45 will be referred to as the "second" connector. These designations are strictly for ease of description and are not intended to be limiting.

A plurality of signal lines extend between memory controller 42 and electrical connectors 44 and 45, for electrical communication with memory modules 46 and 47. More specifically, there are a plurality of sets of signal lines, each set extending to a corresponding, different one of connectors 44 and 45. A first set of signal lines 60 extends to first electrical connector 44, and a second set of signal lines 61 extends to second electrical connector 45. Furthermore, motherboard 41 has a third set of signal lines 62 that extend between the two connectors.

In the embodiment shown, the illustrated signal lines comprise data lines—they carry data that has been read from or that is to be written to memory modules 46 and 47. It is also possible that other signal lines, such as address and control lines, would couple to the memory modules through the connectors. These additional signal lines could have a different interconnection topology than what is shown for signal lines 60, 61, and 62.

The routing of the signal lines is more clearly visible in FIG. 4, in which memory modules 46 and 47 have been omitted for clarity. The illustrated physical routing is shown only as a conceptual aid—actual routing is likely to be more direct, through multiple layers of a printed circuit substrate.

Figure 5:
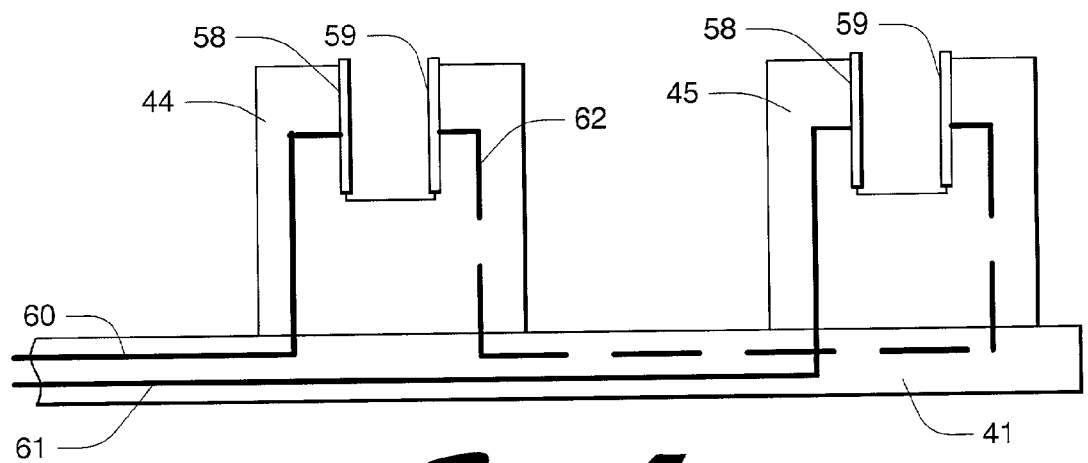
FIGS. 5-7 are cross-sections illustrating an embodiment of a point-to-point memory system in accordance with the invention.

FIG. 5 shows the signal line configuration in more detail. This view shows cross-sections of connectors 44 and 45. Electrical conductors, traces, and/or contacts are indicated symbolically in FIG. 5 by thick solid or dashed lines. Each of the three previously described sets of signal lines is represented by a single one of its conductors, which has been labeled with the reference numeral of the signal line set to which it belongs. It is to be understood that the respective lines of a particular set of signal lines are routed individually in the manner shown.

As discussed above, each connector 44 and 45 has first and second opposed rows of contacts. FIG. 5 shows individual contacts 58 and 59 corresponding respectively to the two contact rows of each connector. It is to be understood that these, again, are representative of the remaining contacts of the respective contact rows. Similarly, following figures will show single module contacts 54 and 55 corresponding to the first and second rows of module connectors.

As is apparent in FIG. 5, the first set of signal lines 60 extends to first contact row 58 of first connector 44. The second set of signal lines 61 extends to the first contact row 58 of second connector 45. In addition, the third set of signal lines 62 extends between the second contact row 59 of first connector 44 and second contact row 59 of second connector 45. The third set of signal lines 62 is represented by a dashed line, indicating that these lines are used only in certain configurations. Specifically, signal lines 62 are used only when a shorting module is inserted into connector 44 or 45. Such a shorting module, the use of which will be explained in more detail below; results in both sets of signal lines 60 and 61 being connected for communications with a single memory module.

Figure 6:
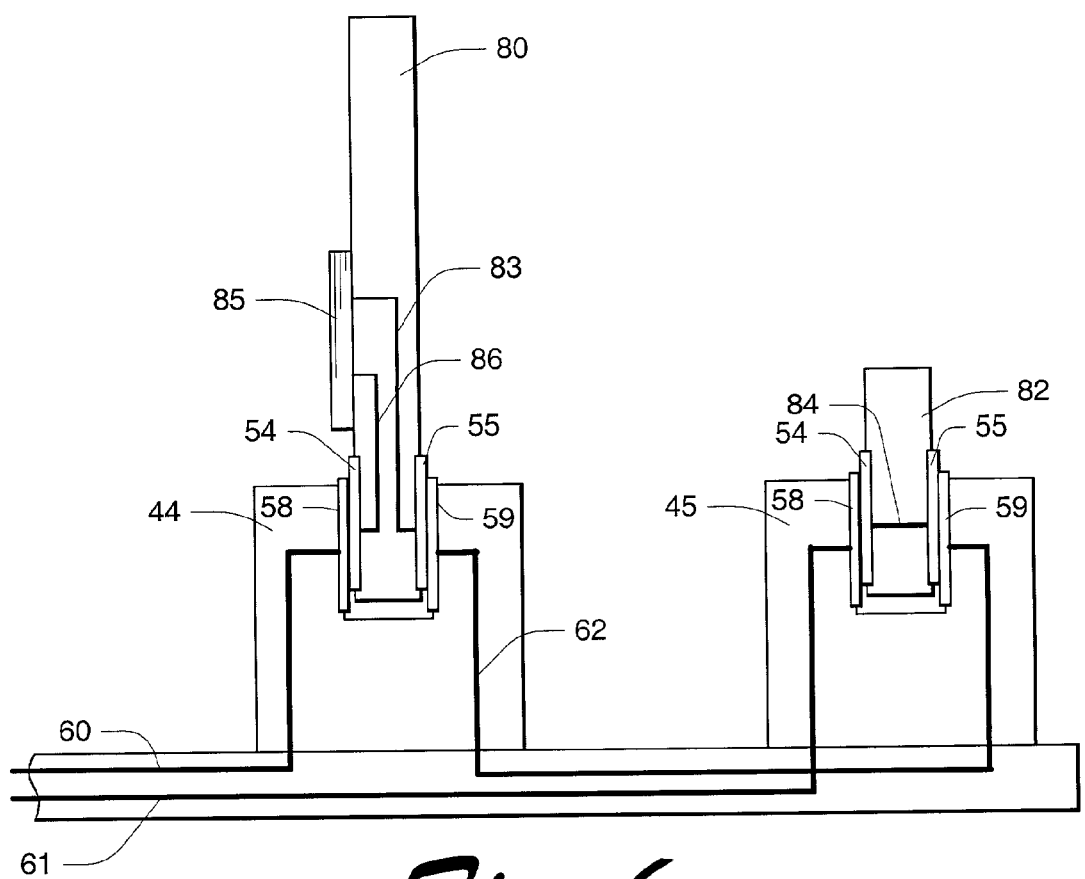

This system can be configured in at least two ways: a first configuration that includes a single memory module in connector 44 and a shorting module in connector 45; and a second configuration that includes a different memory module in each of the two connectors 44 and 45. FIG. 6 illustrates the first configuration, which includes a memory module 80 in the first connector 44 and a shorting module 82 in the second connector 45. The shorting module has shorting conductors 84, corresponding to opposing pairs of connector contacts, between the first and second rows of the second connector. Inserting shorting module 82 into connector 45 connects or couples the second set 61 of signal lines to the second contact row 58 of first connector 44 through the third set of signal lines 62. In this configuration, the two sets of signal lines 60 and 61 are used collectively to communicate between memory controller 42 and single memory module 80.

A single integrated memory circuit 85 is shown in the memory module 80. There are two sets of connections 86 and 83 which couple two sets of pins of the integrated memory circuit to the signal lines 60 and 62, respectively. The integrated memory circuit is configured so that some of its stored information is accessed through the pins coupled to connection 86, and the rest of its stored information is accessed through the pins coupled to connection 83. The memory access operations through these two sets of integrated memory circuit pins may be performed simultaneously. Although only a single integrated memory circuit 85 is shown on the memory unit 80, it is possible to attach two or more integrated memory circuits to the memory unit. In this case, each integrated memory circuit will couple to a distinct subset of connections 86, and to a distinct subset of connections 83. Each of connections 86 and 83 attaches to one pin of one of the integrated memory circuits present on the memory unit 85.

Figure 7:
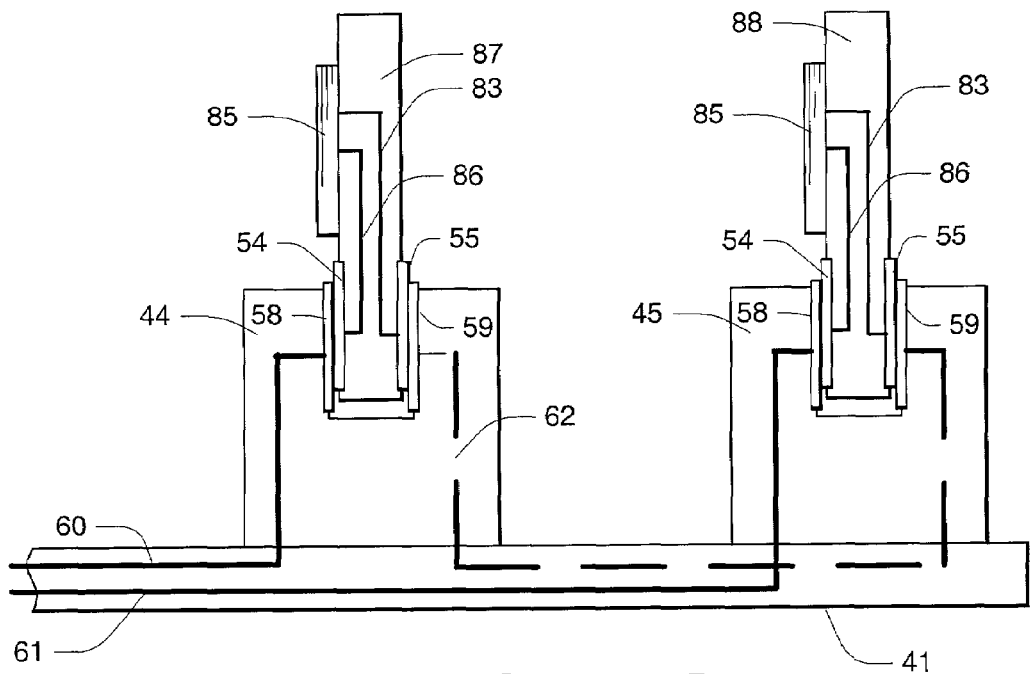

FIG. 7 illustrates the second configuration, in which a different memory module is installed in each of the two connectors 44 and 45, and the two sets of signal lines 60 and 61 communicate respectively with the two different memory modules. In this configuration, the first set of signal lines 60 is used for communications with a first memory module 87, through the first rows of contacts 54 and 58. Similarly, the second set of signal lines 61 communicates with a second memory module 88 through the first rows of contacts 54 and 58. The second rows of contacts 55 and 59 are unused in this configuration, as is the third set of signal lines 62.

In FIG. 7, each memory module 87 and 88 has two sets of connections 86 and 83 that couple two sets of pins of the integrated memory circuit 85 to the signal lines 60 and 62, respectively. However, each integrated memory circuit is configured so that all of its stored information is accessed through the pins coupled to connection 86, and none of its stored information is accessed through the pins coupled to connection 83.

This interconnection system permits the connectors 44 and 45 to accommodate a single type of memory module, which connects to both sets of contacts in the connector. Memory modules 87 and 88 may be plugged into either connector and the integrated memory circuits set to the appropriate access configuration. It is possible to vary number and storage density of integrated memory circuits on the memory modules over a specified range of values.

In the described embodiment, a single type of memory module is used for either configuration. This type of memory module has two sets of storage cells and is configurable in accordance with the two configurations mentioned above. In a first configuration, which uses only a single one of such memory modules, the single memory module is configured so that its first set of storage cells is accessed through connections 86 and its second set of storage cells is accessed through connections 83. In a second configuration, in which one of these memory module is received in each of connectors 44 and 45, each memory module is configured so that both of its sets of storage cells are accessed through connections 86.

The configurability of the memory modules can be implemented either by logic in the memory devices of the modules or as logic that is implemented on each module apart from the memory devices.

In the first case, each memory device has two sets of package pins—corresponding to two sets of memory device storage cells. Each device has multiplexing logic that sets the internal configuration of the memory device to either (a) transfer information of the first set of storage cells through the first set of package pins and transfer information of the second set of storage cells through the second set of package pins, or (b) transfer information of the first and second sets of storage cells through only the first set of package pins, leaving the second set of package pins unused. The first and second sets of package pins are in turn coupled to module connections 86 and 83.

In the second case, where the configurability is implemented as additional logic on the module, similar multiplexing logic is implemented on the module, apart from the devices.

Further details regarding the configurability of the memory module are set forth in the following sections.

Preferably, the access configurations of the memory modules are controllable and programmable by memory controller 42. In addition, the memory controller has logic that is able to detect which connectors have installed memory modules, and to set their configurations accordingly. This provides perhaps the highest degree of flexibility, allowing either one or two memory module to be used in a system without requiring manual configuration steps. If one module is used, it is configured to use two signal line sets for the best possible performance. If two memory modules are present, they are each configured to use one signal line set.

The integrated memory circuit can be configured for the appropriate access mode using control pins. These control pins might be part of the signal line sets 60 and 62, or they might be part of a different set of signal lines. These control pins might be dedicated to this configuration function, or they might be shared with other functions.

Alternatively, the integrated memory circuit might be configured by loading an internal control register with an appropriate programming value. Also, the integrated memory circuit might utilize programmable fuses to specify the configuration mode. Integrated memory circuit configurability might also implemented, for example, by the use of jumpers on the memory modules. Note that the memory capacity of a module remains the same regardless of how it is configured. However, when it is accessed through one signal line set it requires a greater memory addressing range than when it is accessed through two signal line sets.

As described, each integrated memory circuit is configurable and includes contacts corresponding to both rows of connector contacts. Although less desirable, it is also possible to use different arrangements of fixed-configuration memory modules—memory modules that are useable only in one configuration or the other. For example, a system might be populated with a type of memory module that is accessible through only one of its two rows of contacts. In the scenario where only one such module is used, the second set of data lines 61 is unused. Alternatively, a memory module might have a fixed configuration that uses both rows of its connector contacts. In the system shown in FIGS. 3-7, only one such module could be fully utilized at any given time.

Also note that the two configurations shown in FIGS. 6 and 7 could also be implemented with a shorting connector instead of a shorting module. A shorting connector shorts its opposing contacts when no module is inserted (the same result as when the connector 45 in FIG. 6 has a shorting module inserted). A shorting connector with a memory module inserted is functionally identical to the connector 45 in FIG. 7. A shorting connector eliminates the need for a shorting module.

Figure 8:
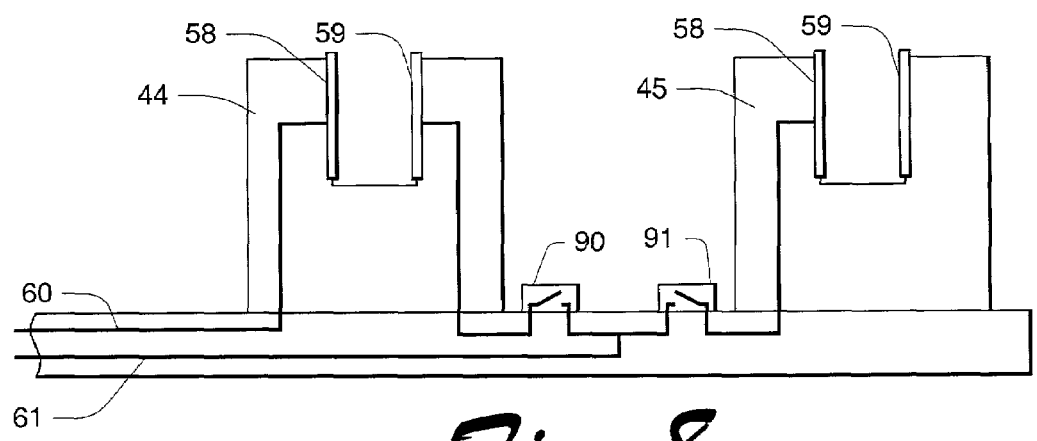
FIG. 8 is a cross-section illustrating another embodiment of a point-to-point memory system in accordance with the invention.
Figure 9:
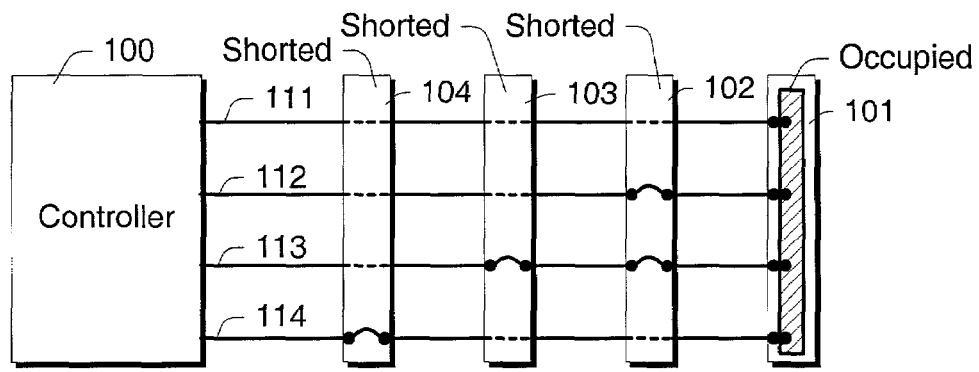
FIGS. 9-13 are diagrammatic illustrations of yet another embodiment of a point-to-point memory system in accordance with the invention.

FIG. 8 shows a variation of this memory layout, in which connector 45 is bypassed with switches or transistors rather than a shorting module. In this embodiment, signal line set 60 extends directly to the first contact row 58 of connector 44. However, second signal line set 61 extends to two switches 90 and 91. These switches, which are preferably MOSFET transistors, control whether second signal line set 61 is connected to the second contact row 59 of connector 44 or to one of the contact rows of connector 45. If switch 90 is activated, the second signal line set 61 is connected to connector 44. If switch 91 is activated, the second signal line set 61 is connected to connector 45. The signal line set connected to contact row 59 of connector 45 of FIG. 8 is not used in this example. The embodiments which follow can also be modified for use with such switch or transistor bypasses rather than physical shorting modules.

Although the embodiments described above use only two memory connectors, the general signal line scheme can be generalized for us with n connectors and memory modules. Generally stated, a system such as this uses a plurality of signal line sets, each extending to a respective module connector. At least one of these sets is configurable or bypassable to extend to a connector other than its own respective connector. Stated alternatively, there are 1 through n sets of signal lines that extend respectively to corresponding connectors 1 through n. Sets 1 through n-1 of the signal lines are configurable to extend respectively to additional ones of the connectors other than their corresponding connectors.

FIGS. 9-12 illustrate this generalization, in a situation where n=4. Specifically, this configuration includes a memory controller 100 and four memory slots or connectors

101, 102, 103, and 104. Four signal line sets are also shown: 111, 112, 113, and 114. Each signal line set is shown as a single line, and is shown as a dashed line when it extends beneath one of the connectors without connection. Actual connections of the signal line sets to the connectors are shown as solid dots. Inserted memory modules are shown as diagonally hatched rectangles, with solid dots indicating signal connections. Note that each inserted memory module can connect to up to four signal line sets. The number of signal line sets to which it actually connects depends upon the connector into which it is inserted. The connectors are identical components, but appear different to the memory modules because of the routing pattern of the four signal line sets on the motherboard.

Generally, each signal line set 111-114 extends respectively to a corresponding connector 101-104. Furthermore, signal lines sets 112, 113, and 114 are extendable to connectors other than their corresponding connectors: signal line set 112 is extendable to connector 101; signal line set 113 is extendable to both connectors 101 and 102; signal line set 114 is extendable to connector 101.

More specifically, a first signal line set 111 extends directly to a first memory connector 101, without connection to any of the other connectors. It connects to corresponding contacts of the first contact row of connector 101. A second signal line set 112 extends directly to a second memory connector 102, where it connects to corresponding contacts of the first contact row. The corresponding contacts of the second contact row are connected to corresponding contacts of the first contact row of first connector 101, allowing the second signal line set to bypass second connector 102 when a shorting module is placed in connector 102.

A third signal line set 113 extends directly to a third memory connector 103, where it connects to corresponding contacts of the first contact row. The corresponding contacts of the second contact row are connected to corresponding contacts of the first contact row of connector 102. The corresponding second contact row contacts of connector 102 are connected to the corresponding contacts of the first contact row of connector 101.

A fourth signal line set 113 extends directly to a fourth memory connector 104, where it connects to corresponding contacts of the first contact row of connector 104. The corresponding contacts of the second contact row are connected to corresponding contacts of the first contact row of first connector 101.

This configuration, with appropriate use of shorting or bypass modules, accommodates either one, two, three, or four memory modules. Each memory module permits simultaneous access through one, two, or four of its four available signal line sets. In a first configuration shown by FIG. 9, a single memory module is inserted in first connector 101. This memory module is configured to permit simultaneous accesses on all of its four signal line sets, which correspond to all four signal line sets 111-114. Connectors 102, 103, and 104 are shorted by inserted shorting modules as shown so that signal line sets 112, 113, and 114 extend to connector 101.

Figure 10:
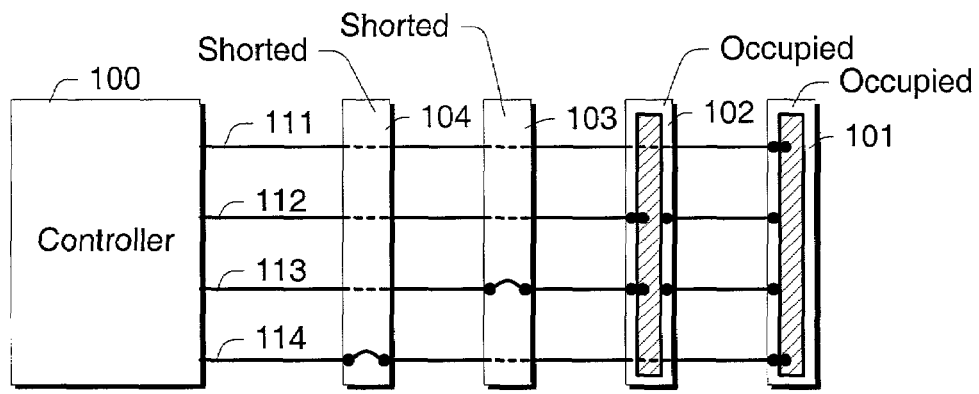

In a second configuration shown by FIG. 10, connectors 103 and 104 are shorted by inserting shorting modules. Thus, signal line sets 111 and 114 extend to connector 101 and the inserted memory module is configured to permit simultaneous accesses on these two signal line sets. Signal line sets 112 and 113 extend to connector 102 and the inserted memory module is configured to permit simultaneous accesses on these two signal line sets.

Figure 11:
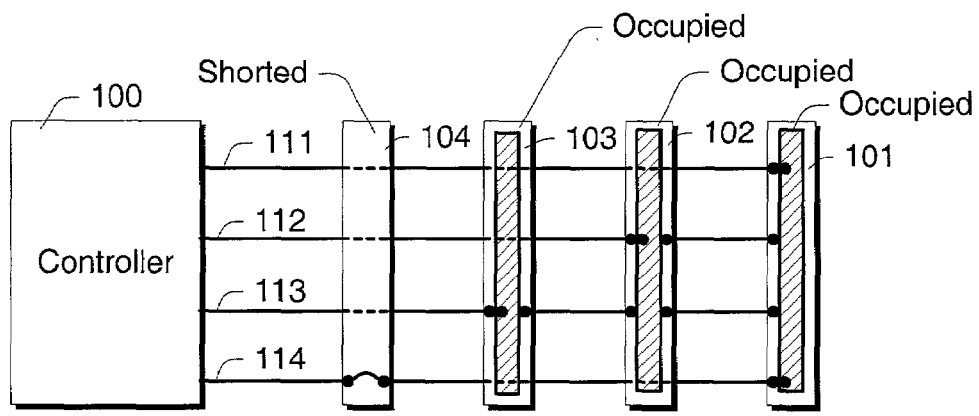

In a third configuration, shown by FIG. 11, connector 104 is shorted by inserting a shorting module, and memory modules are positioned in connectors 101, 102, and 103. Signal line sets 111 and 114 extend to connector 101 and the inserted memory module is configured to permit simultaneous accesses on these two signal line sets. Signal line set 112 extends to connector 102 and the inserted memory module is configured to permit accesses on this signal line set. Signal line set 113 extends to connector 103 and the inserted memory module is configured to permit accesses on this signal line set.

Figure 12:
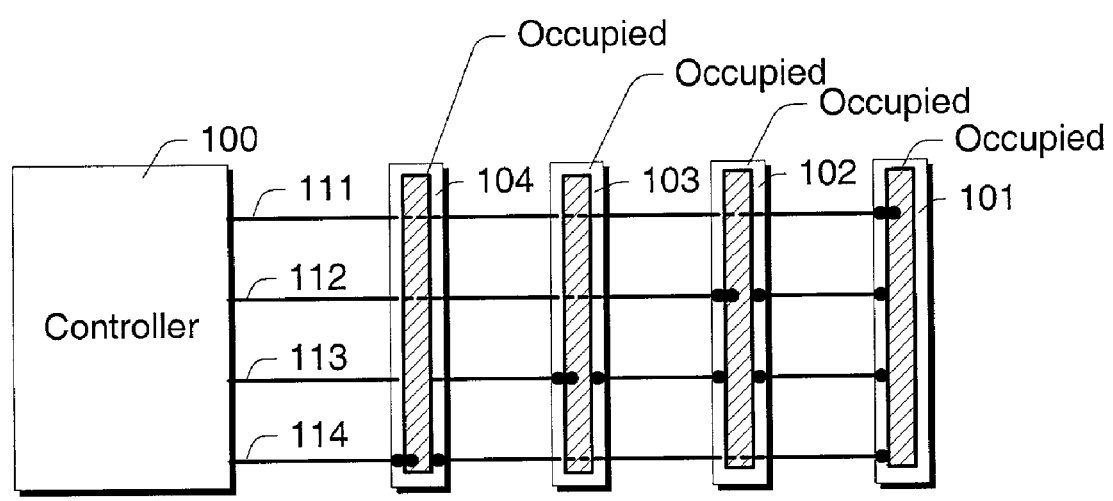

FIG. 12 shows a fourth configuration, with a memory module in each of the four available memory connectors. Each module is connected to use a respective one of the four signal line sets, with no shorting modules in use.

Figure 13:
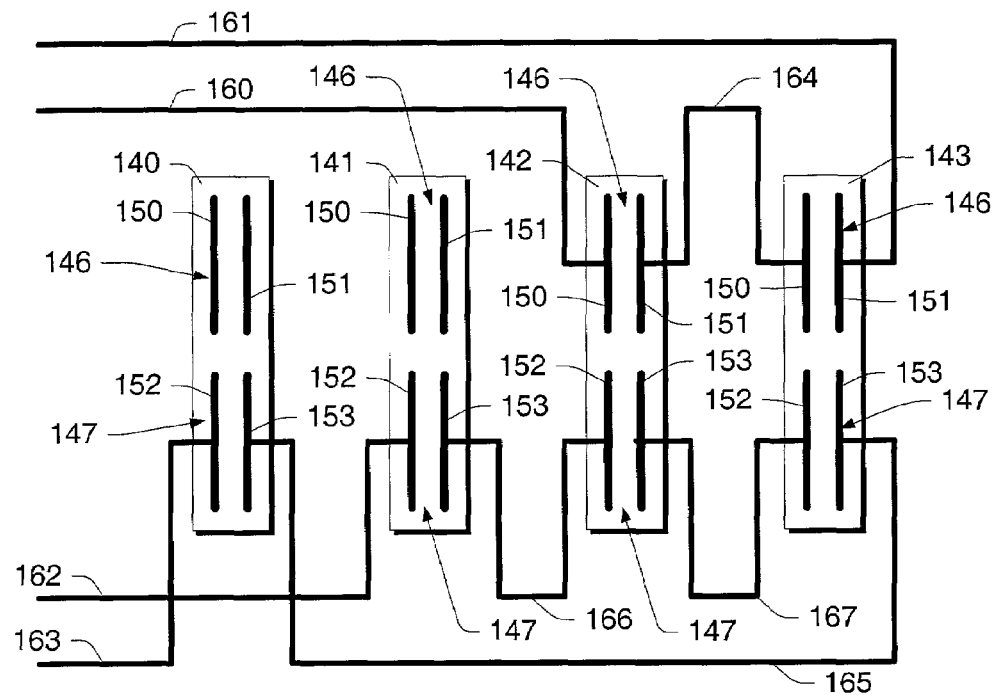

FIG. 13 shows how an interconnection system such as illustrated in FIGS. 9-12 might be implemented using the opposable contact connectors from the two-connector system of FIG. 5. The view in FIG. 13 is from the top looking down onto the four connectors of the interconnect system (the view in FIG. 5 is from the side).

The system of FIG. 13 includes four connectors 140, 141, 142, and 143. Each of these connectors has two pairs of opposed contact sets: a first pair 146 and a second pair 147. Pair 146 comprises a first set of contacts 150 and a second, opposed set of contacts 151. Pair 147 comprises a first set of contacts 152 and a second, opposed set of contacts 153.

Four signal line sets 160, 161, 162, and 163 extend from the memory controller (not shown). A first set 160 of these signal line sets connects directly to contact set 150 of connector 142. A second set 161 of these signal line sets connects directly to contact set 151 of connector 143. There is another signal line set, referenced by numeral 164, that extends between contact set 151 of connector 142 and contact set 150 of connector 143. Thus, signal line sets 160, 161, and 164 are connected to connectors 142 and 143 in a manner that is equivalent to the two connector system of FIG. 5.

The remaining signal line sets are connected as follows. Signal line set 162 extends from the memory controller and connects to contact set 152 of connector 141. Signal line set 163 extends from the memory controller and connects to contact set 152 of connector 140. An additional signal line set 165 extends between contact set 153 of connector 140 and contact set 153 of connector 143. A signal line set 166 extends between contact set 153 of connector 141 and contact set 152 of connector 142. A signal line set 167 extends between contact set 153 of connector 142 and contact set 152 of connector 143.

Memory modules are inserted into the four connectors, starting first with connector 143, then 142, 141, and finally 140. Shorting modules are inserted into unused connectors.

This interconnect system permits more upgrades than the two connector system of FIG. 5, but at the cost of more connector crossings. When there is only one memory module in connector 143, one set of signals must pass from signal line set 162, through shorted contacts 152 and 153 of connector 141 and then through shorted contacts 152 and 153 of connector 142 before reaching contact set 150 of connector 143.

This worst routing case could be eliminated if it were not necessary for the module in connector 142 to drive two signal line sets. This case is important when two memory modules are inserted (one in connector 142 and another in connector 143) and each drive two signal line sets in a balanced fashion. If it were not necessary to balance the memory modules, the worst routing case could be eliminated by connecting signal line set 166 directly to contact set 152 of connector 143 (bypassing connector 142) so no signal passes through more than one shorting module.

Alternatively, switches could be used instead of shorting modules as in FIG. 8. This would ensure that no signal passes through more than one switch element.

Figure 14:
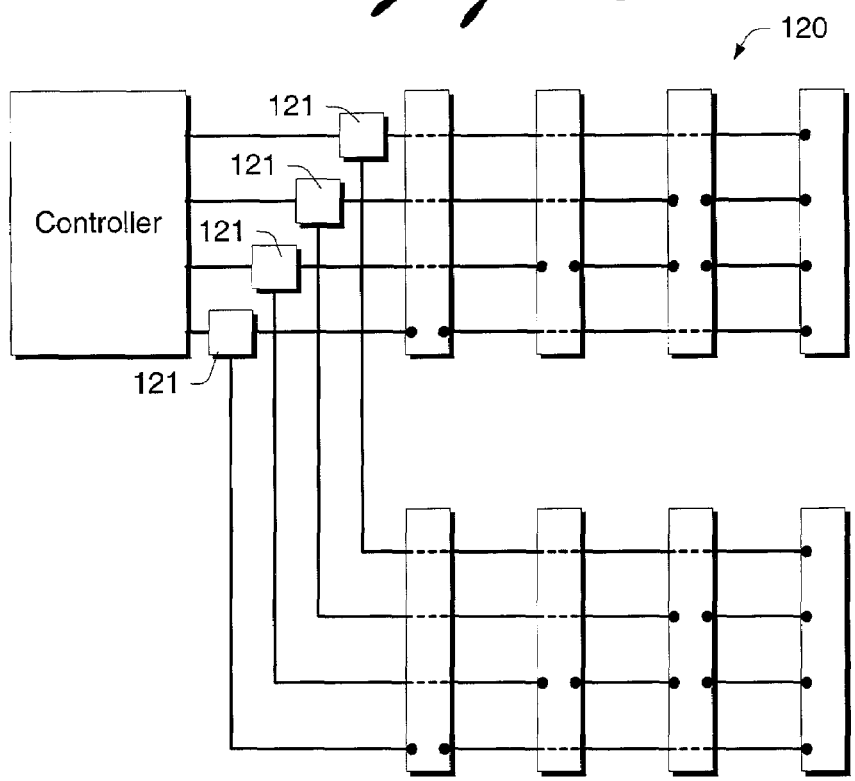
FIG. 14 is a diagrammatic illustration of still another embodiment of a point-to-point memory system in accordance with the invention.

The above examples can be further generalized by noting that each connector position can comprise a plurality of connectors, arranged in parallel. FIG. 14 shows a parallel configuration 120, in which the previously described four connectors have been duplicated and arranged in parallel. The two sets of four connectors are connected using a splitting element 121. The splitting element could consist of a passive power splitting element (three resistors per signal in a delta or wye configuration) that keeps the impedances matched in the three branches of each signal line. Alternatively, some form of bi-directional buffer could be used. This form of parallel expansion could also be applied to the two-connector interconnect system of FIG. 5. Other possible methods of implementing the splitting element include simple wire-stubbing and using some kind of transistor switch element.

The examples above illustrate the concept of using a plurality of signal line sets for different numbers of memory modules. Although the examples thus far assume the utilization of different numbers of connectors to accommodate the different numbers of memory modules, there are other examples in which differing numbers of memory modules might be used with a constant number of memory connectors.

Figure 15:
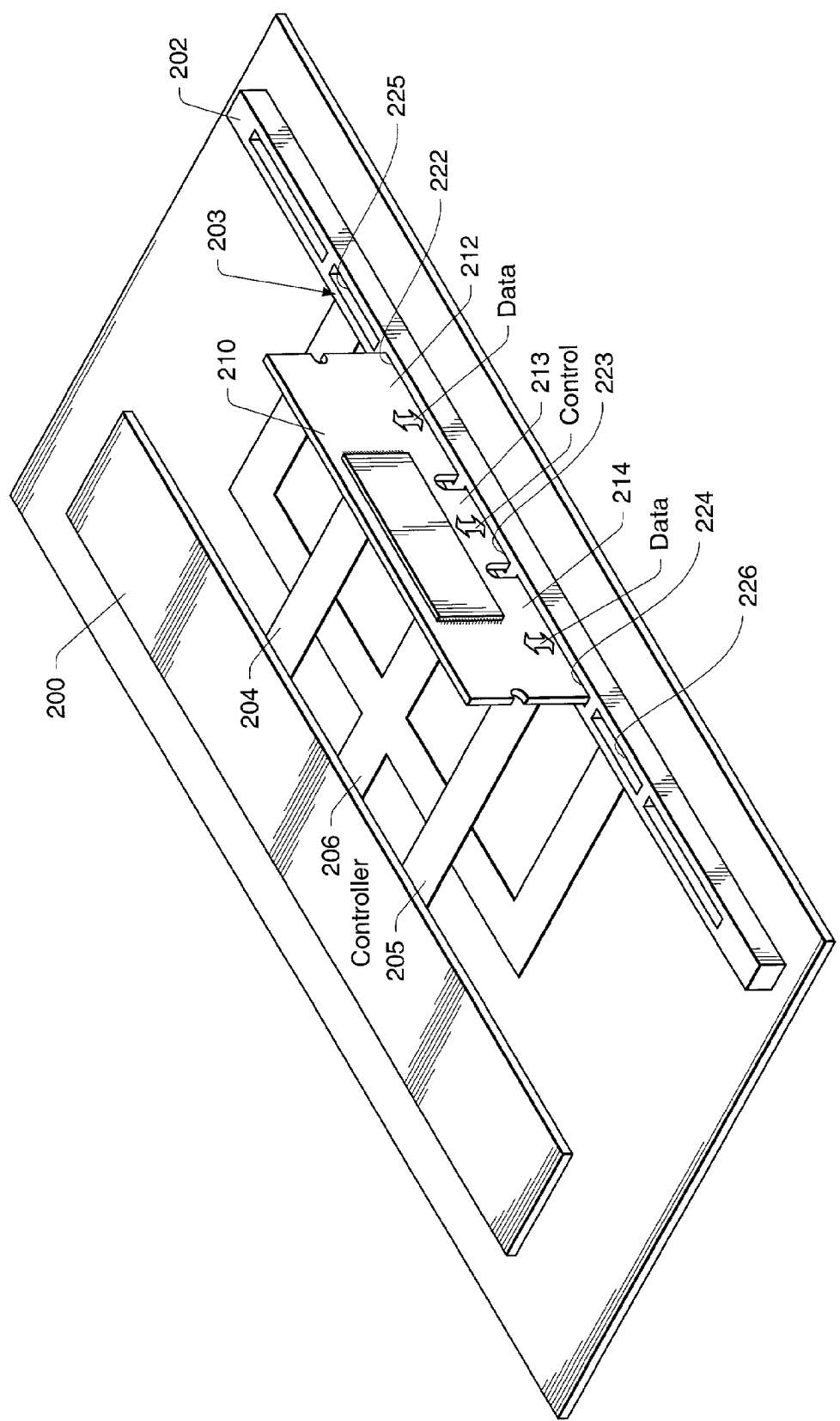
FIGS. 15 and 16 are diagrammatic representations of a point-to-point memory system in accordance with the invention, in which a single connector is used to accommodate a varying number of memory modules.
Figure 16:
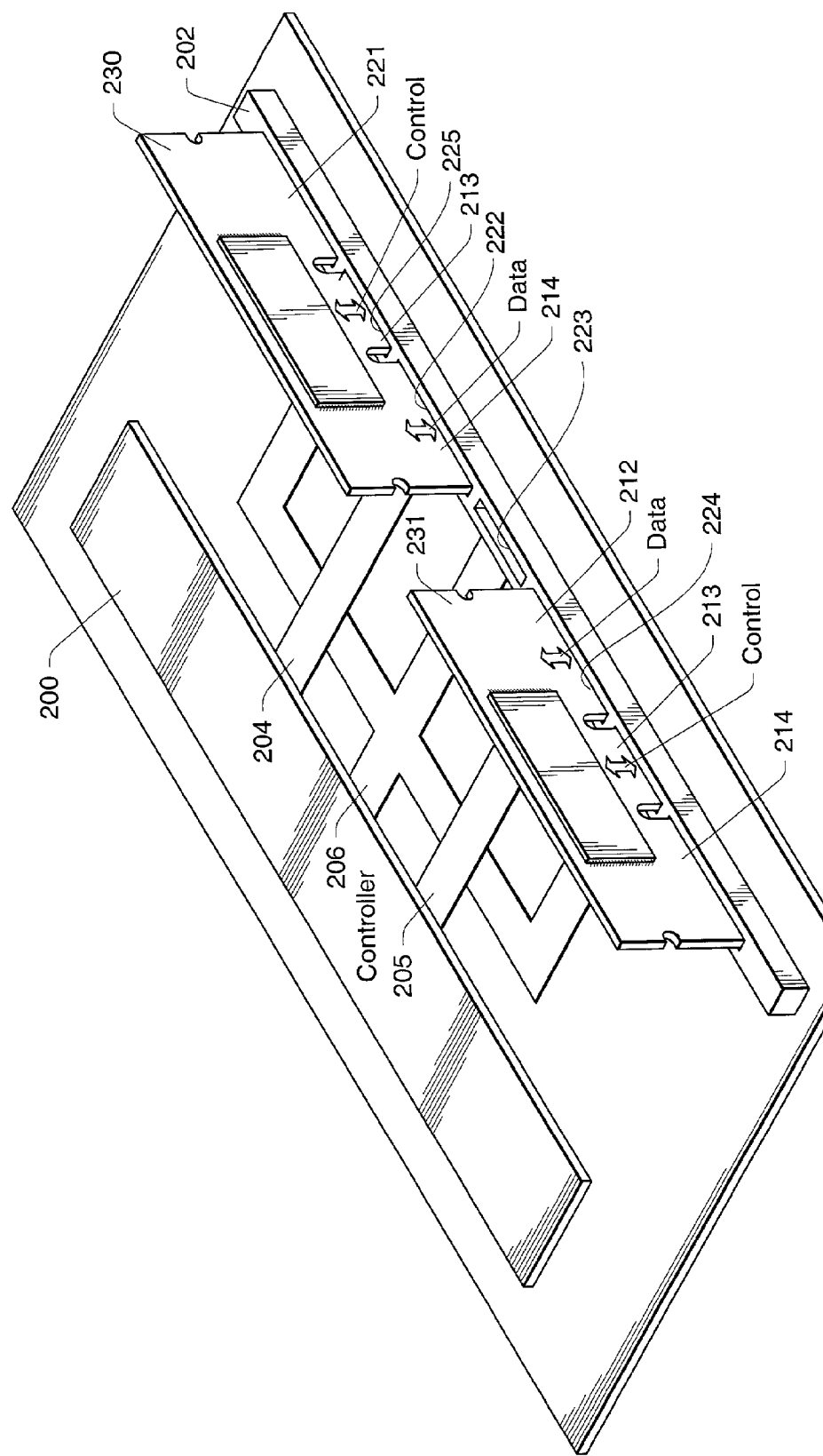

FIGS. 15 and 16 show such an example, in which a single memory connector can be used with either one or two memory modules. The memory system of FIGS. 15 and 16 includes a memory controller 200 and at least a single connector 202. The connector has opposed linear rows of module contacts extending between its outer ends. The contacts of connector 202 are collected into groups, labeled in FIGS. 15 and 16 by reference numerals 222, 223, 224, 225, and 226.

Connector 202 could be replaced by corresponding separate, smaller connectors, one for each of the contact groups, or by some intermediate alternative. These alternate connector implementations would provide the same benefits as the connector 202 shown in FIGS. 15 and 16.

At least two sets of signal lines extend from controller 200 to connector 202: a first data signal line set 204 and a second data signal line set 205. In addition, a set of control signal lines 206 extends between controller 200 and connector 202.

The terms "data" and "control" are used to refer to two classes of signal lines. The "data" signal lines are considered more critical, usually because they are operated at a higher signaling rate and because they are bidirectional. The "control" signal lines are considered less critical, usually because they are operated at a lower signaling rate and because they are unidirectional. The actual signals grouped into these two classes are not limited to the traditional data and control signals, respectively. For example, the "data" signals might include write enable signals or strobe signals, which traditionally would be regarded as control signals, not data. However, because they would operate at the same signaling rate as the data signals, they would be grouped into the "data" signal class.

The connector is configured to receive memory modules that have two or more connection tabs. In the example of FIGS. 15 and 16, a memory module 210 has three connection tabs 212, 213, and 214. Connection tabs 212 and 214 are toward outer ends of the memory module, and connection tab 213 is between tabs 212 and 214. The connection tabs are formed by the substrate of the memory module, and have contacts on two opposing surfaces for mating with corresponding contacts in connector 202.

As noted, the contacts of connector 202 are divided into five different groups. Three of these groups are centrally located in the connector and correspond to three central receptacles 222, 223, and 224 that are positioned and sized to receive the connection tabs 212, 213, and 214 of a single memory module 210. The remaining two contact groups correspond to two outward receptacles 225 and 226, which are located adjacent to and outwardly from receptacles 212 and 214.

First signal line set 204 extends to the contacts of receptacle 222, and second signal line set 205 extends to the contacts of receptacle 224. The signal line set 206 extends in parallel to the contacts of receptacles 223, 225, and 222. The individual signals of signal line set 206 are split in a one-to-three fashion. The splitting of the signal line set 206 could be accomplished with splitting elements like those described in connection with FIG. 14. Alternatively, the controller 200 could drive three copies of the information of the signal line set 206.

The system is configured to receive memory modules in two configurations. FIG. 15 shows a first configuration in which both of the two sets of signal lines 204 and 205 communicate collectively with a single received memory module. The memory module is received centrally in connector 202, with tabs 212, 213, and 214 mating with receptacles 222, 223, and 224, respectively. In this configuration, the memory module is configured to permit simultaneous access on both signal lines sets 204 and 205. The memory module 210 communicates with controller 200 using both of the two available sets of signal lines 204 and 205.

FIG. 16 shows a second configuration, in which the two sets of signal lines 204 and 205 communicate respectively with different memory modules. In this configuration, connector 202 receives two memory modules 230 and 231. First memory module 230 is positioned toward one end of connector 202, its tabs 213 and 214 mating respectively with receptacles 221 and 222. Tab 212 of memory module 230 is unused, but can optionally be received by an outermost connector receptacle whose contacts are unused.

Second memory module 231 is positioned toward the other end of connector 202, its tabs 212 and 213 mating respectively with receptacles 224 and 226. Tab 214 of memory module 231 is unused, but again is optionally received by an outermost connector receptacle 235 whose contacts are unused.

Similar to the previous embodiments, this embodiment utilizes integrated memory circuits that are capable of being accessed with one or two signal line sets depending on how many modules are used. In the configuration involving only a single module, all signal line sets are used to communicate with the single module. In the configuration involving two modules, each signal line set is used for accessing a different memory module.

Memory Modules

Figure 17:
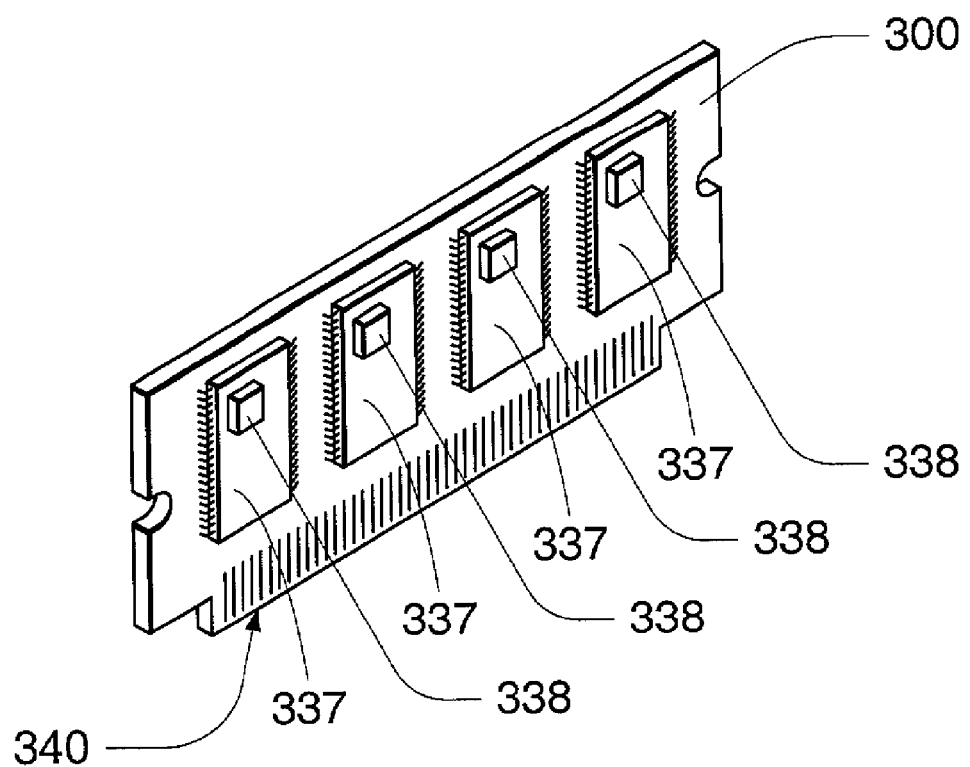
FIG. 17 is diagrammatic representation of a memory module that can be programmed to use different numbers of its data connections.

FIG. 17 shows an example of a memory module 300 that can be used in conjunction with the system described above. The memory module is configurable to transfer its information using different numbers of its data connections. In the described example, there are four possible configurations. As used in circuit described above, however, each module will be configured in one of two ways: (a) to use its full set of available data connections, or (b) to use only a limited subset (half in the described example) of its data connections.

In the following discussion, the modules' alternative configurations are referred to as having or using different data "widths". However, it should be noted that the capacities of the memory modules do not change with the different data widths, at least in the described embodiment. Rather, a module's full set of data is available regardless of the data path width being used. With wider data widths, different subsets of memory cells are accessed through different sets of data connections. With narrower data widths, the different subsets of memory cells are accessed through a common set of data connections. At such narrower data widths, larger addressing ranges are used to access the full set of data.

Memory module 300 has individual memory devices 337 that receive and transmit data bit signals through contacts 340. In the described embodiment, the memory devices are discretely packaged DRAM ICs (integrated circuits), although the memory devices might be any of a number of other types, including but not limited to SRAM, FRAM (Ferroelectric RAM), MRAM (Magnetoresistive or Magnetic RAM), Flash, or ROM.

Memory system 330 has state storage 338 that is repeatedly programmable or changeable to indicate different data widths. The programmed state is used within memory devices 337, which set their device data path width accordingly. In FIG. 17, a state storage component 338 is fabricated within each of memory devices 337. However, the state storage can alternatively be located in a number of different physical locations. For example, the stage storage might be a register within a memory controller, on a system motherboard, or on each module 334.

Various types of state storage are possible. In the described embodiment, the state storage takes the form of a width selection register or latch. This type of state can be easily changed via software during system operation, allowing a high degree of flexibility, and making configuration operations that are transparent to the end user. However, other types of state storage are possible, including but not limited to manual jumper or switch settings and module presence detection or type detection mechanisms. The latter class of mechanisms may employ pull-up or pull-down resistor networks tied to a particular logic level (high or low) which may change state when a module is added or removed from the system.

There are many possible ways to implement a width selection register. Commonly, a register is defined as a state storage element which receives a data input and one or more control inputs. The control inputs determine when the storage node within the register will sample the data input. Some time after the register has sampled the input data, that data will appear on the output of the register.

The term register may apply either to a single-bit-wide register or multi-bit-wide register. In general, the number of bits in the width selection register is a function of the number of possible widths supported by the memory device, although there are many possible ways to encode this information.

Memory Devices

Figure 18:
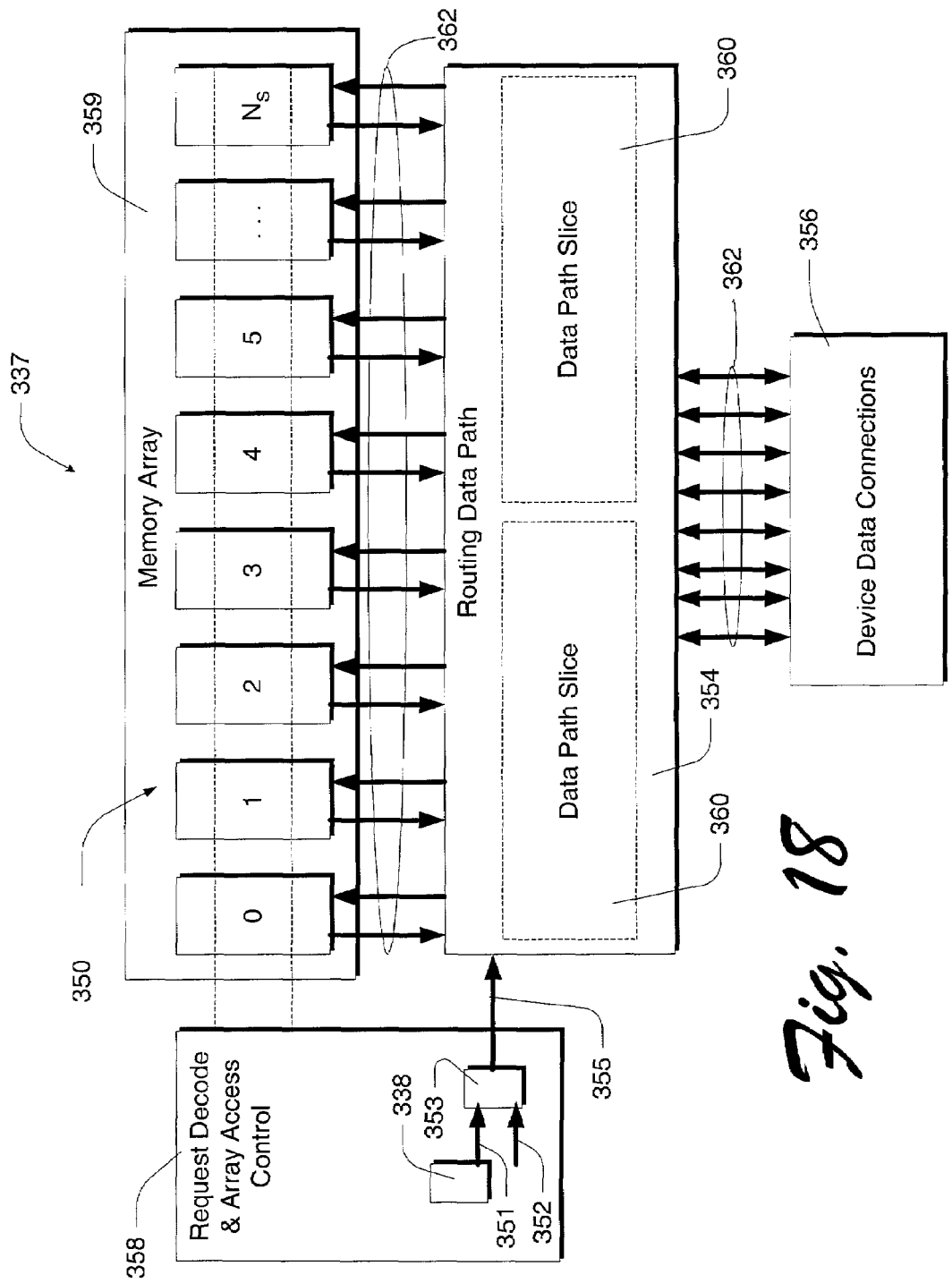
FIG. 18 is a block diagram showing pertinent components of the memory module shown in FIG. 17.

FIG. 18 diagrammatically illustrates relevant components of memory device 8 337 for a case where device width state storage 338 is located on the memory device 337.

Memory device 337 has control logic 358 that decodes request and address information, controls memory transfers between the storage array and the device data connections 356, and optionally performs other tasks. Other such tasks might include handling or controlling register accesses, refresh operations, calibration operations, power management operations, or other functions.

Memory device 337 also has state storage 338, which in this embodiment comprises two programmable memory cells, latches, or other mechanisms for storing state information. Within the two cells, two bits are stored. The two bits can represent four different values, through different combinations of bit values (Ex: 00=x1, 01=x2, 10=x4, 11=x8). The different stored values correspond to different programmed device widths. For this embodiment, state register 338 is implemented within device control logic 358, although it could potentially be implemented anywhere within device 337.

State register 338 can be repeatedly programmed and changed during operation of the memory device to indicate different data path widths. Changing the value or values of the state register changes the data path width of the memory device, even after the memory device has already been used for a particular width. In general, there is no need to power-down or reset the device when switching between different data path widths, although this may be required due to other factors.

The state register in this example is programmable by a memory controller (not shown), through a request/command interface (not shown). Many types of memory use a request/command interface to issue read or write cycles, perform device initialization, perform control register reads or writes, or issue other commands such as array refresh, I/O calibration, or power management commands. For the embodiment of FIG. 18, a special register programming command is issued across the request/command interface to set the desired width of the data path. Other embodiments might use dedicated signals or pins to communicate this information to the memory device.

Memory device 337 further comprises an array of storage cells, collectively referred to as the memory array 359. The memory array stores or retrieves data information associated with a particular address provided as part of a write or read command. The memory device 337 has a maximum device data path width equivalent to the number of data pins provided on the memory device's package. The memory array 359 has a maximum array access width defined as the largest number of bits which can be accessed in a single array transfer operation. Using the techniques described herein, the memory device 337 may be programmed to operate at data path widths and array access widths other than these maximum values.

In the embodiment of FIG. 18, a serialization ratio is defined as follows:

$$R_S = W_A : W_{DP}$$

Where:
$R_S$=Serialization Ratio
$W_A$=Programmed Array Access Width
$W_{DP}$=Programmed Device Data Path Width For example, if the array access width $W_A$ is 128-bits and the data path width $W_{DP}$ is 16-bits, the serialization ratio is 8:1. For the described embodiment, the serialization ratio remains constant for all programmed data path widths, so that the programmed array access width scales proportionally with programmed data path width. In other embodiments, the serialization ratio could vary as the programmed data path width varies.

Still referring to the embodiment of FIG. 18, the memory array 359 is subdivided into a number of subsections 350. The memory array 359 is connected to a routing data path 354 by the array access data wires 362. When the data path width and array access width are set to their maximum values as defined above, some number of array subsections 350 will be accessed in parallel. As the programmed array access width is reduced from its maximum value, some number of the array access data wires will not be used for the target transaction.

There are many possible ways to select the set of active array access data wires 362 for a particular target transaction.

In general, an interleaving scheme is chosen so that the full memory array 359 can be accessed regardless of the programmed array access width. Accesses will generally be interleaved based upon the address of the target transaction. Interleaving of the array access data wires can be achieved via either fine-grain (wire or bit-line) or coarse-grain (array subsection) interleaving or any combination of the two. Other interleaving schemes are also possible.

The memory device has a plurality of data connections 356, referred to herein as device data connections. These connections are typically package pins or contacts that are in turn connected to connectors 340 of module 300 (FIG. 17) via the module's circuit board. The device data connections are typically coupled to the device die via bond wires or solder bumps (flip chip) between the package substrate and the die.

Memory device 337 also comprises routing decode and control logic 353 and routing data path 54. Routing decode and control logic 353 controls how data is routed between the device data connections 356 and the memory array 359, while the routing data path 354 performs the actual data routing. The more complete description of the function of routing decode and control logic 353 is given below.

The routing data path 354 provides flexibility in the way that data is routed between the device data connections 356 and the memory array 359. The routing data path 354 may optionally perform serialization and deserialization functions depending upon the desired serialization ratio as defined above. As the array access width is reduced from its maximum value, array access granularity (measured in quanta of data) is commensurately reduced, and an access interleaving scheme is generally employed to ensure that all storage locations within the memory array 359 can be accessed. The array access data wires 362 will be subdivided into several target subsets. The address of the transaction will determine which target subset of the data wires will be utilized for the data transfer portion of the transaction. As the device data path width varies, the data path interleaving and routing scheme will vary accordingly.

Routing decode and control logic 353 receives width selection information 351 based upon the desired device data path width. The source of the width selection information 351 will vary depending upon whether internal or external (with respect to the device) state storage is used. If the storage register is external to the memory device, the width selection information 351 is communicated to the memory device via electrical signals propagated through module and/or memory device connectors. These electrical signals are then propagated through the memory device package and input circuitry to routing decode and control logic 353. If the storage register 338 is located on the memory device 300, the width selection information 351 is directly provided to the routing decode and control logic 353, typically via metal wiring.

The routing decode and control logic 353 receives the width selection information 351 and address information 352 and decodes it to determine the appropriate routing for the data between the device data connections 356 and memory array subsections 350 through the routing data path 354. Routing control wires 355 enable the appropriate path through the routing data path 354. For the described embodiment, the routing data path is implemented with multiple data path slices 360, which are regularly repeated to match the number of device data connections 356 provided by the device.

Figure 19:
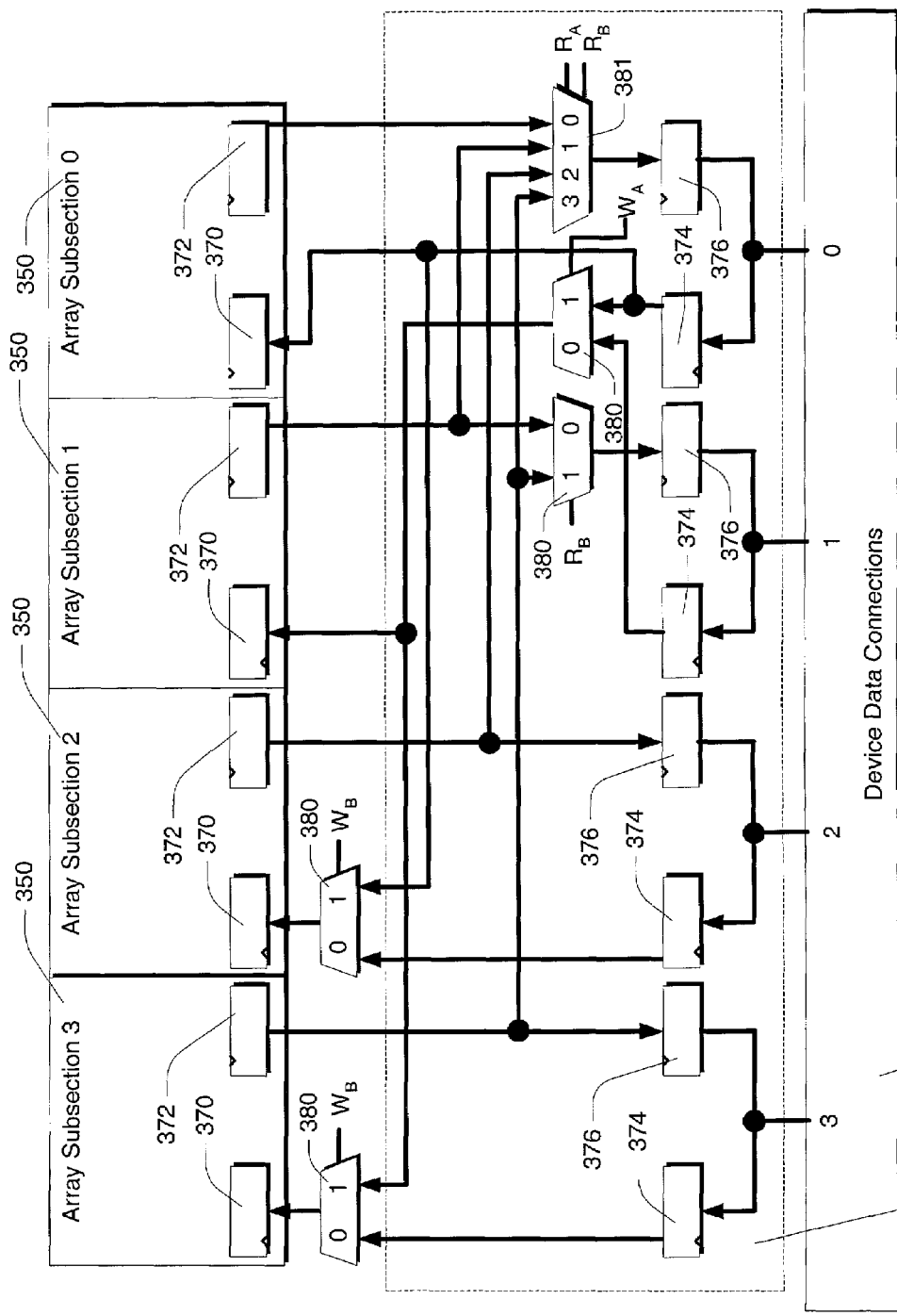
FIG. 19 is a block diagram showing multiplexing and demultiplexing logic such as used in the memory module shown in FIG. 17.

FIG. 19 shows a specific implementation of a multiplexer/demultiplexer that can form the routing data path 354. For this embodiment, the serialization ratio is 1:1. Serialization ratios greater than 1:1 are possible with the addition of serial-to-parallel (write) and parallel-to-serial (read) conversion circuits. In this example, there are four memory array subsections 350 which interface to each data path slice 360, each slice supporting four pairs of read and write data bits.

Generally, the routing data path 354 contains multiplexing logic and demultiplexing logic. The multiplexing logic is used during read operations, and the demultiplexing logic is used during write operations. The multiplexing logic and demultiplexing logic for each data path slice are designed to allow one, two, or four device data connections 356 to be routed to the four memory array subsections 350 which interface to a particular data path slice.

In the one-bit wide configuration, device data connection 0 can be routed to/from any of the four memory array subsections 350. In the 2-bit wide configuration, device data connections 0 and 1 can be routed to/from memory array subsection 0 and 1 or 2 and 3, respectively. In the 4-bit wide configuration, device data connections 0, 1, 2, and 3 route straight through to/from memory array subsections 0, 1, 2, and 3, respectively.

Multiple data path slices 360 may be used to construct devices with greater than four device data connections 356. For example, a device having 16 device data connections 356 could use four such data path slices while supporting 3 different programmable widths; namely, 16, 8, or 4-bits wide. The preferred embodiment of FIG. 19 shows the utilization of two such data path slices.

Shown in FIG. 19 are the four array subsections 350 associated with one of data path slices 360. Each subsection has an input latch 370 and an output latch 372. The routing data path also has an input latch 374 and an output latch 376 for each device data connection. The routing data path further comprises five multiplexers 380, 381. Multiplexers 380 are two-input multiplexers controlled by a single control input. Multiplexer 381 is a four input multiplexer controlled by two control inputs.

The routing logic of FIG. 19 is configured to use two write control signals $W_A$ and $W_B$, and two read control signals $R_A$ and $R_B$. These signals control multiplexers 380, 381. They are based on the selected data path width and bits of the requested memory address or transfer phase (see FIG. 20, described below). Routing decode and control logic 353 (FIG. 18) produces these signals in response to the programmed data width, whether the operation is a read or write operation, and appropriate addressing information 352.

FIG. 20 shows the control values used for data path slice widths of one, two, and four. FIG. 20 also indicates which of device data connections 356 are used for each data width.

When a width of one is selected during a read operation, the circuit allows data from any one of the four associated memory array subsections to be presented at device data connection 0. Control inputs $R_A$ and $R_B$ determine which of data bit signals will be presented at any given time. $R_A$ and $R_B$ are set (at this data width) to equal the least significant two bits ($A_1$, $A_0$) of the memory address corresponding to the current read operation.

When a width of one is selected during a write operation, the circuit accepts the data bit signal from device data connection 0 and routes it to all of the four memory array subsections simultaneously. Control inputs $W_A$ and $W_B$ are both set to a logical value of one to produce this routing. Other control circuits 358 (FIG. 18) control which of the array subsection input latches 370 are active during any single write operation, so that each data bit signal is latched into the appropriate array subsection. Only one of the latches corresponding to the memory array subsections is operated during any given memory cycle.

When a width of two is selected during a read operation, the circuit allows any two of the four data bit signals associated with the memory array subsections to be present at device data connections 0 and 1. To obtain this result, $R_A$ is set to 0, and $R_B$ is equal to the lower bit ($A_0$) of the memory address corresponding to the current read operation. $R_B$ determines which of two pairs of data bit signals (0 and 1 or 2 and 3) are presented at device data connections 0 and 1 during any given read operation.

When a width of two is selected during a write operation, the circuit accepts the data bit signals from device data connections 0 and 1, and routes them either to array subsections 0 and 1, or to array subsections 2 and 3. $W_A$ and $W_B$ are set to 0 and 1, respectively, to obtain this result. Other control circuits 358 (FIG. 18) control which pair of the array subsection input latches 370 are active during any single write operation, so that each pair of data bit signals is latched into the appropriate pair of array subsections.

When a width of four is selected by setting all of the control inputs ($R_A$, $R_B$, $W_A$, and $W_B$) to 0, read and write data signals are passed directly between array subsections and corresponding device data connections.

The circuit of FIG. 19 is just one example out of many possible designs. At the expense of increased logic and wiring complexity, it is possible to use a more elaborate crossbar-type scheme that could potentially route any single data bit signal to any array subsection or to any of the device data connections. Also, note that there are many possible alternatives for the number and width of array subsections, number of device data connections per device, serialization ratios, and width of data path slices.

CONCLUSION

The embodiments described above provide increased flexibility in point-to-point memory systems. Specifically, the systems allow for a plurality of memory slots or positions, while in many cases utilizing the fullest possible signal width given the available number of signal lines. In a fully populated system, for example, a single, different signal line set will be used for each memory module. When fewer memory modules are present, however, accesses will utilize more than one signal line set on some memory modules to utilize the full number of available signal line sets.

Although details of specific implementations and embodiments are described above, such details are intended to satisfy statutory disclosure obligations rather than to limit the scope of the following claims. Thus, the invention as defined by the claims is not limited to the specific features described above. Rather, the invention is claimed in any of its forms or modifications that fall within the proper scope of the appended claims, appropriately interpreted in accordance with the doctrine of equivalents.

The invention claimed is:

1. A signal interconnect system for use with one or more modules, the signal interconnect system comprising:
    a first connector configured to receive a first module having a first set of storage cells;
    a second connector configured to receive a second module having a second set of storage cells;
    first and second signal line sets that are usable in at least two configurations, the configurations comprising:
    a first configuration in which the first and second signal line sets are coupled to the first connector and transferring data to ones of the first set of storage cells on the first module; and
    a second configuration in which the first signal line set is coupled to the first connector and transferring data to ones of the first set of storage cells on the first module, and the second signal line set is coupled to the second connector and transferring data to ones of the second set of storage cells on the second module while the first signal line set is transferring data to the ones of the first set of storage cells on the first module.

2. A signal interconnect system as recited in claim 1, further comprising:
    a third signal line set coupled to the first connector for communications with the first module;
    wherein the second signal line set is coupled to the first connector through the third signal line set in the first configuration.

3. A signal interconnect system as recited in claim 1, further comprising at least one switch to selectively couple the second signal line set either to the first connector or to the second connector.

4. A signal interconnect system as recited in claim 1, wherein the connectors are configured to receive memory modules each comprising one or more memory devices.

5. A signal interconnect system as recited in claim 1, wherein the connectors are configured to receive logic modules each comprising one or more logic devices.

6. A signal interconnect system as recited in claim 1, further comprising:
    a third signal line set coupled to the first connector and communicating with the first module in the first configuration;
    wherein the second connector is configured to couple the second signal line set to the first connector through the third signal line set when no module is received by the second connector 7. A signal interconnect system as recited in claim 1, further comprising:
    a third signal line set coupled to the first connector for communications with the first module;
    wherein the second connector is configured to receive a shorting module in the second configuration to couple the second signal line set to the third signal line set.

8. A signal interconnect system as recited in claim 1, further comprising:
    logic that is responsive to whether the second module is received by the second connector, to configure the first module to transfer information either through both the first and second signal line sets or through only the first signal line set.

9. A signal interconnect system as recited in claim 1, further comprising:
    a memory controller that communicates with the first array of storage cells of the first module through the first and second signal line sets in the first configuration and with the first and second arrays of storage cells of the first and second modules through the first and second signal line sets in the second configuration.

10. A signal interconnect system as recited in claim 1, further comprising:
    a memory controller that communicates with the first module through the first and second signal line sets in the first configuration and with the first and second modules through the first and second signal line sets in the second configuration;
    the memory controller having logic that is responsive to whether the second module is received by the second connector, to configure the first module to transfer information either through both the first and second signal line sets or through only the first signal line set.

11. A signal interconnect system as recited in claim 1, further comprising:
a module received in the first connector;
wherein the received module is alternatively configurable to (a) transfer information through the first and second signal line sets, or (b) transfer information through only the first signal line set.

12. A signal interconnect system as recited in claim 1, further comprising:
a module received in the first connector;
wherein the received module is responsive to one or more signals received through the first connector to (a) transfer information through the first and second signal line sets, or (b) transfer information through only the first signal line set.

13. A signal interconnect system as recited in claim 1, further comprising:
a module received in the first connector;
the module comprising a memory device;
wherein the memory device is programmable to (a) transfer information through the first and second signal line sets, or (b) only the first signal line set.

14. A signal interconnect system as recited in claim 1, further comprising:
a module received in the first connector;
the module comprising a memory device;
wherein the memory device has one or more fuses to program the memory device to (a) transfer information through the first and second signal line sets, or (b) transfer information through only the first signal line set.

15. A signal interconnect system as recited in claim 1, further comprising:
a module received in the first connector;
the module comprising a memory device;
wherein the memory device has one or more registers that program the memory device to (a) transfer information through the first and second signal line sets, or (b) transfer information through only the first signal line set.

16. A signal interconnect system as recited in claim 1, further comprising:
a module received in the first connector;
the module comprising a memory device;
wherein the memory device is responsive to one or more received signals to (a) transfer information through the first and second signal line sets, or (b) transfer information through only the first signal line set.

17. A signal interconnect system for use with one or more modules, the signal interconnect system comprising:
first and second connectors;
a first signal line set coupled to the first connector for communications with a first module that is receivable by the first connector;
a second signal line set coupled to the second connector;
a third signal line set coupled to the first connector;
the second and third signal line sets being usable in at least two configurations, comprising:
a first configuration in which the second signal line set is coupled to the first connector through the third signal line set for communications with the first module and in which the first signal line set communicates with a first set of storage cells on the first module while the third signal line set communicates with a second set of storage cells on the first module;
a second configuration in which the second signal line set is coupled exclusively to the second connector for communications with a second module that is receivable by the second connector, and in which the second signal line set transfers data to ones of the second set of storage cells on the second module while the first signal line set transfers data to the ones of the first set of storage cells on the first module.

18. A signal interconnect system as recited in claim 17, wherein the connectors are configured to receive memory modules comprising one or more memory devices.

19. A signal interconnect system as recited in claim 17, wherein the connectors are configured to receive logic modules comprising one or more logic devices.

20. A signal interconnect system as recited in claim 17, wherein the second connector is configured to couple the second signal line set to the third signal line set when no module with storage cells is received by the second connector.

21. A signal interconnect system as recited in claim 17, wherein the second connector receives a shorting module in the first configuration to couple the second signal line set to the third signal line set.

22. A signal interconnect system as recited in claim 17, wherein:
the first module transfers information through the first and third signal line sets in the first configuration; and
the first module transfers information through only the first signal line set in the second configuration.

23. A signal interconnect system as recited in claim 17, further comprising:
logic that is responsive to whether the second module is received by the second connector, to configure the first module to transfer information either through both the first and third signal line sets or through only the first signal line set.

24. A signal interconnect system as recited in claim 17, further comprising:
a memory controller that communicates with the first module through the first and second signal line sets in the first configuration and with the first and second modules through the first and second signal line sets in the second configuration.

25. A signal interconnect system as recited in claim 17, further comprising:
a memory controller that communicates with the first module through the first and second signal line sets in the first configuration and with the first and second modules through the first and second signal line sets in the second configuration;
the memory controller having logic that is responsive to whether the second module is received by the second connector, to configure the first module to transfer information either through both the first and third signal line sets or through only the first signal line set.

26. A signal interconnect system for use with one or more modules, the signal interconnect system comprising:
first and second connectors;
a first signal line set coupled to the first connector for communications with a first module, in the first connector, that includes a first set of storage cells;
a second signal line set coupled to the second connector;
a third signal line set coupled to the first connector;
the second and third signal line sets being usable in at least two configurations, comprising:
a first configuration in which the second signal line set is coupled to the first connector through the third signal line set for communications with the first module and in which the first signal line communicates with the first set of storage cells on the first module while the third signal line set communicates with the first set of storage cells on the first module;
a second configuration in which the second signal line set is coupled exclusively to the second connector for communications with a second module that includes a second set of storage cells and is receivable by the second connector, and in which the first signal line set communicates with the first set of storage cells on the first module while the second signal line set communicates with the second set of storage cells on the second module;
wherein the first module is alternatively configurable to (a) transfer information through the first and third signal line sets, or (b) transfer information through only the first signal line set.

27. A signal interconnect system for use with one or more modules, the signal interconnect system comprising:
first and second connectors;
a first signal line set coupled to the first connector for communications with a first module that is receivable by the first connector;
a second signal line set coupled to the second connector;
a third signal line set coupled to the first connector;
the second and third signal line sets being usable in at least two configurations, comprising:
a first configuration in which the second signal line set is coupled to the first connector through the third signal line set for communications with the first module and in which the first signal line communicates with a first set of storage cells on the first module while the third signal line set communicates with the first set of storage cells on the first module; and
a second configuration in which the second signal line set is coupled exclusively to the second connector for communications with a second module that includes a second set of storage cells and is receivable by the second connector, and in which the first signal line set communicates with the first set of storage cells on the first module while the second signal line set communicates with the second set of storage cells on the second module;
wherein the first module is responsive to one or more signals received through the first connector to (a) transfer information through the first and third signal line sets, or (b) transfer the information through only the first signal line set.

28. A signal interconnect system for use with one or more modules, the signal interconnect system comprising:
first and second connectors;
a first signal line set coupled to the first connector for communications with a first module that is receivable by the first connector;
a second signal line set coupled to the second connector;
a third signal line set coupled to the first connector;
the second and third signal line sets being usable in at least two configurations, comprising:
a first configuration in which the second signal line set is coupled to the first connector through the third signal line set for communications with the first module and in which the first signal line communicates with a first set of storage cells on the first module while the third signal line set communicates with the first set of storage cells on the first module;
a second configuration in which the second signal line set is coupled exclusively to the second connector for communications with a second module that includes a second set of storage cells and is receivable by the second connector, and in which the first signal line set communicates with the first set of storage cells on the first module while the second signal line set communicates with the second set of storage cells on the second module; and
the first module comprising a memory device;
wherein the memory device is programmable to (a) transfer information through the first and third signal line sets, or (b) transfer the information through only the first signal line set.

29. A signal interconnect system for use with one or more modules, the signal interconnect system comprising:
first and second connectors;
a first signal line set coupled to the first connector for communications with a memory device, having a first set of storage cells, on a first module that is receivable by the first connector;
a second signal line set coupled to the second connector;
a third signal line set coupled to the first connector;
the second and third signal line sets being usable in at least two configurations, comprising:
a first configuration in which the second signal line set is coupled to the first connector through the third signal line set for communications with the first module and in which the first signal line set communicates with the first set of storage cells on the first module while the third signal line set communicates with the first set of storage cells on the first module; and
a second configuration in which the second signal line set is coupled exclusively to the second connector for communications with a second module that includes a second set of storage cells and is receivable by the second connector, and in which the first signal line set communicates with the first set of storage cells on the first module while the second signal line set communicates with the second set of storage cells on the second module;
wherein the memory device is responsive to one or more received signals to (a) transfer information through the first and third signal line sets, or (b) transfer information through only the first signal line set.

30. A data interconnect system for use with one or more modules, the data interconnect system comprising:
one or more connectors that form at least first, second, third, and fourth contact groups;
a first signal line set coupled to the second contact group; and
a second signal line set coupled to the third contact group;
the one or more connectors being configured to receive modules in at least two configurations:
a first configuration in which a single received module mates with the second and third contact groups, wherein the single received module simultaneously communicates via the first and second signal line sets; and
a second configuration in which a first received module mates with the first and second contact groups and a second received module mates with the third and fourth contact groups, wherein the first and second received modules simultaneously communicate via the respective first and second signal line sets.

31. A signal interconnect system as recited in claim 30, wherein the second and third contact groups are between the first and fourth contact groups.

32. A signal interconnect system as recited in claim 30, further comprising: a third signal line set that is coupled to the first and fourth contact groups.

33. A signal interconnect system as recited in claim 30, wherein the one or more connectors are configured to receive memory modules comprising one or more memory devices.

34. A signal interconnect system as recited in claim 30, wherein the one or more connectors are configured to receive logic modules comprising one or more logic devices.

35. A signal interconnect system as recited in claim 30, wherein:
the single received module transfers information from a set of storage cells through the first and second signal line sets in the first configuration; and
the first module transfers information from the set of storage cells through only the first signal line set in the second configuration.

36. A signal interconnect system as recited in claim 30, further comprising:
a memory controller that communicates with the single received module through the first and second signal line sets in the first configuration and with the first and second modules through the first and second signal line sets in the second configuration.

37. A signal interconnect system as recited in claim 30, further comprising:
a memory controller that is responsive to whether there are one or two received modules to communicate with either the single received module through the first and second signal line sets or with the first and second modules through the first and second signal line sets.

38. A signal interconnect system as recited in claim 30, wherein the single received module is alternatively configurable to (a) transfer information through the first and second signal line sets, or (b) transfer information through only the first signal line set.

39. A signal interconnect system as recited in claim 30, wherein the single received module is responsive to one or more signals received through the one or more connectors to (a) transfer information through the first and second signal line sets, or (b) transfer information through only the first signal line set.

40. A signal interconnect system as recited in claim 30, wherein the single received module comprises a memory device;
wherein the memory device is programmable to (a) transfer information through the first and second signal line sets, or (b) transfer information through only the first signal line set.

41. A signal interconnect system as recited in claim 30, wherein the single received module comprises a memory device;
wherein the memory device is responsive to one or more signals to (a) transfer information through the first and second signal line sets, or (b) transfer information through only the first signal line set.

42. A signal interconnect system for use with one or more installable modules, the signal interconnect system comprising:
one or more connectors configured to receive the one or more installable modules;
at least two sets of signal lines extending to the one or more connectors for electrical communication with the one or more received installable modules;
the sets of signal lines being alternatively configurable to (a) support a single-module configuration in which data is simultaneously transferred separately to different sets of storage cells on a single received installable module or (b) support a multi-module configuration in which data is simultaneously transferred respectively to different received installable modules.

43. A signal interconnect system as recited in claim 42, wherein each connector is configured to receive a single memory module.

44. A signal interconnect system as recited in claim 42, wherein at least a particular one of the connectors is configured to receive either said single received installable module or said different received installable modules.

45. A signal interconnect system as recited in claim 42, wherein each set of signal lines extends to a different one of the connectors.

46. A signal interconnect system as recited in claim 42, wherein each set of signal lines extends to the same connector.

47. A signal interconnect system as recited in claim 42, wherein:
the connectors include first and second connectors;
a first of the sets of signal lines extends to the first connector;
a second of the sets of signal lines extends to the second connector;
a third of the sets of signal lines extends between the first and second connectors.

48. A signal interconnect system as recited in claim 42, wherein:
the connectors include first and second connectors;
a first of the sets of signal lines extends to the first connector;
a second of the sets of signal lines extends to the second connector;
the second connector is shortable to connect the second set of signal lines to the first connector.

49. A signal interconnect system as recited in claim 42, wherein:
the connectors include first and second connectors;
a first of the sets of signal lines extends to the first connector;
a second of the sets of signal lines is switchable to extend either to the first connector or to the second connector.

50. A configurable memory system comprising:
a. a memory controller;
b. at least one electrical connector adapted to receive a plurality of memory modules, including a first memory module having a first memory array and a second memory module having a second memory array;
c. a first set of data lines extending between the memory controller and the at least one electrical connector;
d. a second set of data lines extending between the memory controller and the at least one electrical connector;
e. the memory system supporting a plurality of memory configurations, including:
   i. a first memory configuration in which the first memory module is in physical contact with the at least one electrical connector and coupled to the memory controller via the first and second sets of data lines; and
   ii. a second memory configuration in which the first memory module is in physical contact with the at least one electrical connector and coupled to the memory controller via the first set of data lines and the second memory module is in physical contact with the at least one electrical connector and coupled to the memory controller via the second set of data lines;
   iii. wherein the memory controller, in the second memory configuration, simultaneously transfers data to the first and second memory arrays of the respective first and second memory modules.

51. The configurable memory system of claim 50, further comprising a third set of data lines coupled in series with the second set of data lines in the first memory configuration.

52. The configurable memory system of claim 50, wherein the at least one connector is a single connector adapted to receive one or both of the first and second memory modules.

53. The configurable memory system of claim 50, wherein the at least one connector includes a first connector adapted to receive the first memory module and a second connector adapted to receive the second memory module.

54. The configurable memory system of claim 53, wherein the first memory module physically contacts the first connector and is electrically coupled to the second set of data lines via the second connector in the first memory configuration.

55. A circuit board comprising:
 a circuit substrate supporting first and second signal-line sets;
 a controller mounted to the circuit substrate and connected to the first and second signal-line sets; and
 first and second connectors, mounted to the circuit substrate, to receive respective removable logic modules;
 wherein the circuit board supports a plurality of logic-module configurations, including:
 a dual-module configuration in which the first signal-line set forms a first plurality of point-to-point connections with a first of the removable modules installed in the first connector and is disconnected from a second of the removable logic modules installed in the second connector, the second signal-line set is disconnected from the installed first removable logic module and the second signal-line set forms a second plurality of point-to-point connections with a second of the removable modules the installed second removable logic module in the second connector, wherein the first and second removable modules communicate simultaneously over the respective first and second signal-line sets; and
 a single-module configuration in which the first and second signal-line sets form a third plurality of point-to-point connections with a single one of the removable logic modules installed in one of the first and second connectors; wherein the single one of the removable modules communicates simultaneously over the first and second signal-line sets.

56. The circuit board of claim 55, further comprising a shorting module to select between the dual-module configuration and the single-module configuration.

57. The circuit board of claim 56, wherein the shorting module installs in one of the first and second connectors.

58. The circuit board of claim 55, further comprising a switch to select between the dual-module configuration and the single-module configuration.

59. The circuit board of claim 55, wherein the sum of the first and second pluralities of point-to-point connections equals the number of connections in the third plurality of point-to-point connections.

60. The circuit board of claim 59, wherein the first and second pluralities of point-to-point connections are equal in number.

61. The circuit board of claim 55, wherein the logic modules are memory modules and the controller is a memory controller.

62. The circuit board of claim 55, wherein the modules are variable-width modules.

63. The circuit board of claim 55, wherein the signal-line sets are to convey data between the controller and at least one of the connectors.

64. The circuit board of claim 55, wherein the signal-line sets are to convey control signals or address signals between the controller and the installed module or modules.

65. A method for supporting single-module and multi-module interconnect topologies on a single circuit board, the method comprising:
 providing a circuit substrate with first and second signal-line sets;
 mounting a controller to the circuit substrate and connecting the controller to the first and second signal-line sets;
 mounting first and second connectors to the circuit substrate, wherein the first and second connectors are to receive respective removable modules, and wherein the circuit board includes the substrate, the controller, the signal-line sets, and the connectors;
 determining whether the circuit board is to be used in the single-module interconnect topology or the multi-module interconnect topology; and
 if the circuit board is to be used in the multi-module interconnect topology, installing a first of the removable modules in the first connector and a second of the removable modules in the second connector, forming a first plurality of point-to-point connections between the controller and the first of the removable modules via the first signal-line set and the first connector, and forming a second plurality of point-to-point connections between the controller and the second of the removable modules via the second signal-line set and the second connector;
 wherein the first and second pluralities of point-to-point connections are to convey information from the controller to the first and second removable modules simultaneously over the respective first and second pluralities of point-to-point connections in the multi-module interconnect topology; and
 if the circuit board is to be used in the single-module interconnect topology, installing a single one of the removable modules in the first connector, and forming a single plurality of point-to-point connections between the controller and the single one of the removable modules via the first and second signal-line sets and the first connector;
 wherein the first and second pluralities of point-to-point connections are to convey information from the controller to the single one of the removable modules simultaneously over the first and second pluralities of point-to-point connections in the single-module interconnect topology.

66. The method of claim 65, further comprising connecting the first and second sets of signal lines to the first connector via a shorting module if the circuit board is to be used in the single-module interconnect topology.

67. The method of claim 66, further comprising installing the shorting module in one of the first and second connectors.

68. The method of claim 65, wherein forming a single plurality of point-to-point connections comprises activating a switch.

69. The method of claim 65, wherein the sum of the first and second pluralities of point-to-point connections equals the number of connections in the single plurality of point-to-point connections.

70. The method of claim 69, wherein the first and second pluralities of point-to-point connections are equal in number.

71. The method of claim 65, wherein the logic modules are memory modules and the controller is a memory controller.

72. The method of claim 65, wherein the modules have a data width, the method further comprising matching the data width of the single or first and second modules to match the number of point-to-point connections to the single or first and second modules.

73. The method of claim 65, wherein the signal-line sets are to convey data between the controller and storage cells on the modules via at least one of the connectors.

74. The method of claim 65, wherein the signal-line sets are to convey control signals or address signals between the controller and the installed module or modules.

* * * * *

UNITED STATES PATENT AND TRADEMARK OFFICE
CERTIFICATE OF CORRECTION

PATENT NO. : 7,610,447 B2 Page 1 of 1
APPLICATION NO. : 09/797099
DATED : October 27, 2009
INVENTOR(S) : Richard E. Perego et al.

It is certified that error appears in the above-identified patent and that said Letters Patent is hereby corrected as shown below:

Column 5, line 29 and 60 the word "module" should be changed to --modules--
Column 10, line 59 the word "circuit" should be changed to --circuits--
Column 11, line 45 the word --a-- should be added after the words "register or"
Column 16, line 34 there should be a --.-- added after the words "second connector"
Column 18, line 67 the word --set-- should be added after the words "signal line"
Column 19, lines 30 and 61 the word --set-- should be added after the words "signal line"
Column 23, lines 33-34 the words "the installed second removable logic module" should be deleted Signed and Sealed this Twenty-second Day of December, 2009

David J. Kappos
*Director of the United States Patent and Trademark Office*